(12) United States Patent
Arao et al.

(10) Patent No.: US 8,263,926 B2
(45) Date of Patent: Sep. 11, 2012

(54) PHOTOELECTRIC CONVERSION DEVICE AND MANUFACTURING METHOD THEREOF

(75) Inventors: Tatsuya Arao, Ebina (JP); Atsushi Hirose, Atsugi (JP); Kazuo Nishi, Kofu (JP); Yuusuke Sugawara, Minamiarpusu (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/752,173

(22) Filed: Apr. 1, 2010

(65) Prior Publication Data
US 2010/0187405 A1    Jul. 29, 2010

Related U.S. Application Data

(63) Continuation of application No. 11/436,086, filed on May 18, 2006, now Pat. No. 7,705,283.

(30) Foreign Application Priority Data

May 23, 2005  (JP) ................................ 2005-148864

(51) Int. Cl.
- *H03F 3/08* (2006.01)
- *H01L 27/00* (2006.01)
- *H04N 3/14* (2006.01)

(52) U.S. Cl. ................. 250/214 A; 250/208.1; 330/308; 348/308

(58) Field of Classification Search .............. 250/214 R, 250/214 A, 214 LA, 214 LS, 214.1, 208.1–208.6, 250/214 AG, 214 C; 257/257, 290, 292, 257/431, 432, 444, 448, 291, 451, 458; 348/300–311; 330/252, 277, 288, 308; 327/51, 514, 515

See application file for complete search history.

(56) References Cited

U.S. PATENT DOCUMENTS

| 4,065,668 A | 12/1977 | Monticelli |
| 4,118,621 A | 10/1978 | Monticelli et al. |
| 4,251,742 A | 2/1981 | Beelitz |

(Continued)

FOREIGN PATENT DOCUMENTS

DE    92 13 278    1/1993

(Continued)

OTHER PUBLICATIONS

European Search Report for Application No. 06009252.5 dated Sep. 15, 2006.

*Primary Examiner* — Georgia Y Epps
*Assistant Examiner* — Don Williams
(74) *Attorney, Agent, or Firm* — Eric J. Robinson; Robinson Intellectual Property Law Office, P.C.

(57) ABSTRACT

It is an object to provide a photoelectric conversion device which detects light ranging from weak light to strong light. The present invention relates to a photoelectric conversion device having a photodiode having a photoelectric conversion layer, an amplifier circuit including a thin film transistor and a bias switching means, where a bias which is connected to the photodiode and the amplifier circuit is switched by the bias switching means when intensity of incident light exceeds predetermined intensity, and accordingly, light which is less than the predetermined intensity is detected by the photodiode and light which is more than the predetermined intensity is detected by the thin film transistor of the amplifier circuit. By the present invention, light ranging from weak light to strong light can be detected.

25 Claims, 27 Drawing Sheets

U.S. PATENT DOCUMENTS

| | | |
|---|---|---|
| 4,454,416 A | 6/1984 | Gontowski, Jr. et al. |
| 4,713,819 A | 12/1987 | Yoshikawa |
| 5,059,809 A | 10/1991 | Fukuyama |
| 5,298,455 A | 3/1994 | Arai et al. |
| 5,442,198 A | 8/1995 | Arai et al. |
| 5,479,208 A | 12/1995 | Okumura |
| 5,574,293 A | 11/1996 | Arai et al. |
| 5,576,222 A | 11/1996 | Arai et al. |
| 5,591,988 A | 1/1997 | Arai et al. |
| 5,708,471 A * | 1/1998 | Okumura ............. 348/301 |
| 5,760,760 A | 6/1998 | Helms |
| 5,936,231 A | 8/1999 | Michiyama et al. |
| 5,952,992 A | 9/1999 | Helms |
| 5,969,809 A | 10/1999 | Nishina |
| 5,981,936 A | 11/1999 | Fujiie |
| 6,057,738 A | 5/2000 | Ku et al. |
| 6,200,825 B1 * | 3/2001 | Yoshimi et al. ............. 438/24 |
| 6,245,601 B1 | 6/2001 | Kobayashi et al. |
| 6,287,888 B1 | 9/2001 | Sakakura et al. |
| 6,363,044 B1 | 3/2002 | Lehr et al. |
| 6,531,711 B2 | 3/2003 | Sakakura et al. |
| 6,867,469 B2 | 3/2005 | Kobayashi et al. |
| 6,897,429 B1 * | 5/2005 | Turner et al. ............. 250/214 R |
| 6,914,230 B2 * | 7/2005 | Baer ............. 250/214.1 |
| 7,002,881 B2 | 2/2006 | Okuda et al. |
| 7,009,164 B2 | 3/2006 | Kobayashi et al. |
| 7,030,551 B2 | 4/2006 | Yamazaki et al. |
| 7,042,980 B2 | 5/2006 | Endo |
| 7,067,788 B2 | 6/2006 | Bardsley |
| 7,091,462 B2 | 8/2006 | Wilson et al. |
| 7,253,391 B2 | 8/2007 | Koyama et al. |
| 7,335,951 B2 | 2/2008 | Nishi et al. |
| 7,449,718 B2 | 11/2008 | Nishi et al. |
| 7,495,272 B2 | 2/2009 | Maruyama et al. |
| 7,501,306 B2 | 3/2009 | Nishi et al. |
| 2004/0042707 A1 | 3/2004 | Imai et al. |
| 2006/0163577 A1 | 7/2006 | Yamazaki et al. |
| 2009/0212285 A1 | 8/2009 | Nishi et al. |

FOREIGN PATENT DOCUMENTS

| | | |
|---|---|---|
| EP | 0 445 757 | 9/1991 |
| EP | 0497592 | 8/1992 |
| EP | 0642179 | 3/1995 |
| EP | 1 523 043 | 4/2005 |
| EP | 1583148 | 10/2005 |
| JP | 60-020655 | 2/1985 |
| JP | 03-257794 | 11/1991 |
| JP | 06-342899 | 12/1994 |
| JP | 07-115223 | 5/1995 |
| JP | 09-329493 | 12/1997 |
| JP | 10-256841 | 9/1998 |
| JP | 11-145443 A | 5/1999 |
| JP | 11-304586 A | 11/1999 |
| JP | 3444093 | 9/2003 |
| JP | 2003-315149 | 11/2003 |
| JP | 2004-022051 | 1/2004 |
| JP | 2005-136394 | 5/2005 |
| JP | 2005-167157 | 6/2005 |
| WO | WO-2004/068582 | 8/2004 |
| WO | 2005/114749 | 12/2005 |

* cited by examiner

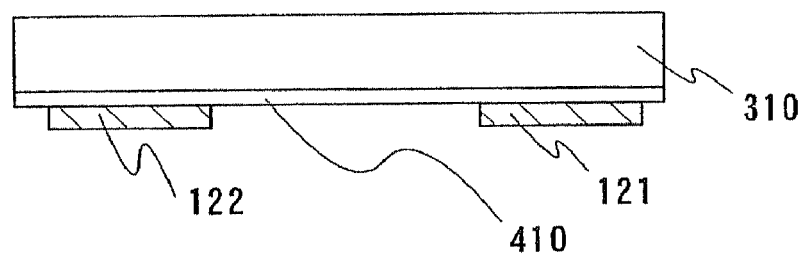
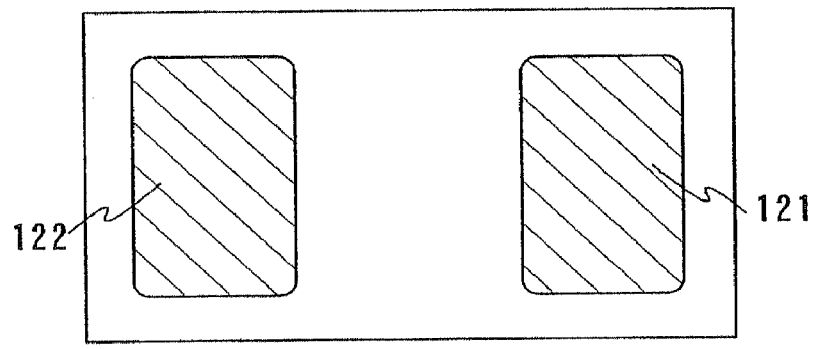
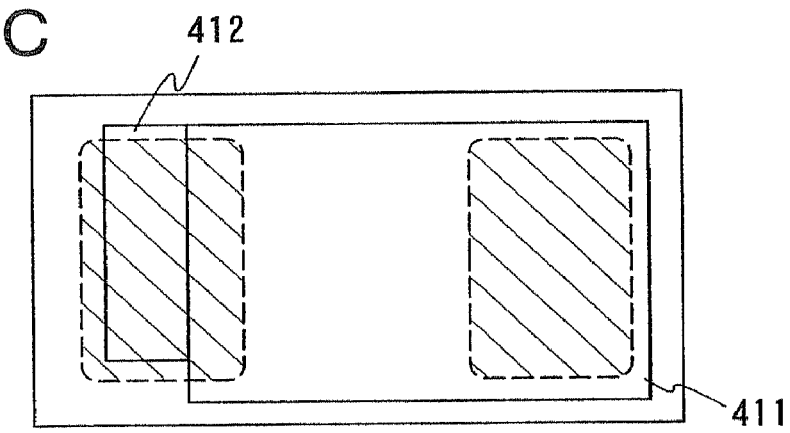

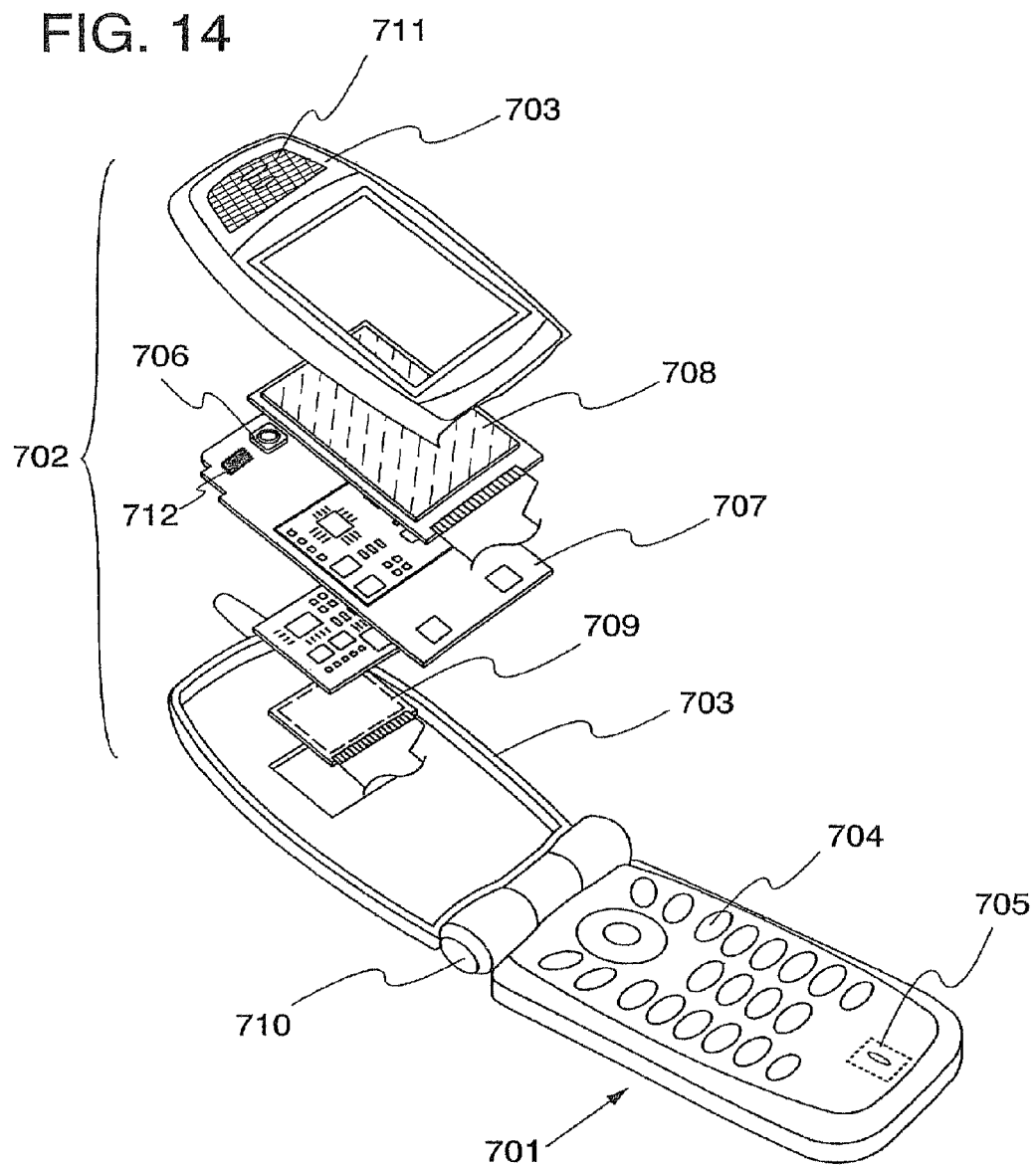

PHOTOELECTRIC CONVERSION DEVICE AND MANUFACTURING METHOD THEREOF

BACKGROUND OF THE INVENTION

1. Field of the Invention

The present invention relates to a photoelectric conversion device, and particularly relates to a photoelectric conversion device including a thin film semiconductor element and a manufacturing method thereof. In addition, the present invention relates to an electronic device using a photoelectric conversion device.

2. Description of the Related Art

A number of photoelectric conversion devices used for detecting an electromagnetic wave are generally known, for example, a photoelectric conversion device which has sensitivity from ultra-violet rays to infrared rays is referred to as a light sensor in general. A light sensor which has sensitivity to a visible light region with a wavelength of 400 to 700 nm is particularly referred to as a visible light sensor, and a number of visible light sensors are used for devices which need illuminance adjustment, on/off control, or the like depending on a human living environment.

In particular, in a display device, brightness of the periphery of the display device is detected to adjust the display luminance. It is because unnecessary electric power can be reduced by detecting the peripheral brightness and obtaining appropriate display luminance. For example, a light sensor for such adjustment of luminance is used for a cell phone or a personal computer.

In addition, not only peripheral brightness but also luminance of backlight of a display device, particularly, a liquid crystal display device is also detected by a light sensor to adjust luminance of a display screen.

In such a light sensor, a photodiode is used for a sensing part and an output current of the photodiode is amplified in an amplifier circuit. As such an amplifier circuit, for example, a current mirror circuit is used (Patent Document 1).
[Patent Document 1] Patent Document No. 3444093

SUMMARY OF THE INVENTION

By a conventional light sensor, weak light can be detected; however, there is a problem that a range of an output current is expanded and voltage used for one gray-scale is lowered when light, from weak light to strong light, is detected.

A photoelectric conversion device of the present invention has a photodiode including a photoelectric conversion layer, a current mirror of a TFT and a bias switching means. In the photoelectric conversion device of the present invention, the current mirror circuit is irradiated with light, and functions as a second light sensor at the time of forward bias. Note that the bias switching means may be constituted by a circuit.

According to the present invention, weak light can be detected by a photodiode and light having certain illuminance or more can be detected by a TFT. Accordingly, an output current can be reduced once, a range of an absolute value of the output current can be narrowed, and a voltage value of one gray-scale can be increased.

The present invention relates to a photoelectric conversion device having a photodiode including a photoelectric conversion layer, an amplifier circuit including a thin film transistor and a bias switching means, where a bias which is connected to the photodiode and the amplifier circuit is switched by the bias switching circuit at a predetermined intensity of incident light, and light which is less than the predetermined intensity is detected by the photodiode and light which is more than the predetermined intensity is detected by the thin film transistor of the amplifier circuit.

The present invention relates to a driving method of a photoelectric conversion device having a photodiode including a photoelectric conversion layer, an amplifier circuit including a thin film transistor and a bias switching means, the method comprising the steps of: switching a bias which is connected to the photodiode and the amplifier circuit by the bias switching circuit at a predetermined intensity of incident light, and detecting light which is less than the predetermined intensity by the photodiode or light which is more than the predetermined intensity by the thin film transistor of the amplifier circuit.

In the present invention, the photoelectric conversion layer has a p-type semiconductor layer, an i-type semiconductor layer and an n-type semiconductor layer.

In the present invention, the thin film transistor has a source region or a drain region, a channel formation region, a gate insulating film, and a gate electrode.

In the present invention, the photodiode and the amplifier circuit is formed over a light-transmitting substrate.

In the present invention, a direction of incident light which is detected by the photodiode is the same as a direction of incident light which is detected by the thin film transistor.

In the present invention, the thin film transistor is a top gate thin film transistor.

In the present invention, with a substrate as the center, a direction of incident light which is detected by the photodiode and a direction of incident light which is detected by the thin film transistor are opposite to each other.

In the present invention, the thin film transistor is a bottom gate thin film transistor.

According to the present invention, by detecting weak light by a photodiode and detecting strong light by a TFT, a wide range of light intensity can be detected.

BRIEF DESCRIPTION OF DRAWINGS

In the accompanying drawings:
FIGS. 7A to 7C are views each showing a manufacturing process of a photoelectric conversion device of the present invention.

FIG. 14 is a view showing a device on which a photoelectric conversion device of the present invention is mounted;

DETAILED DESCRIPTION OF THE INVENTION

Figure 1A:
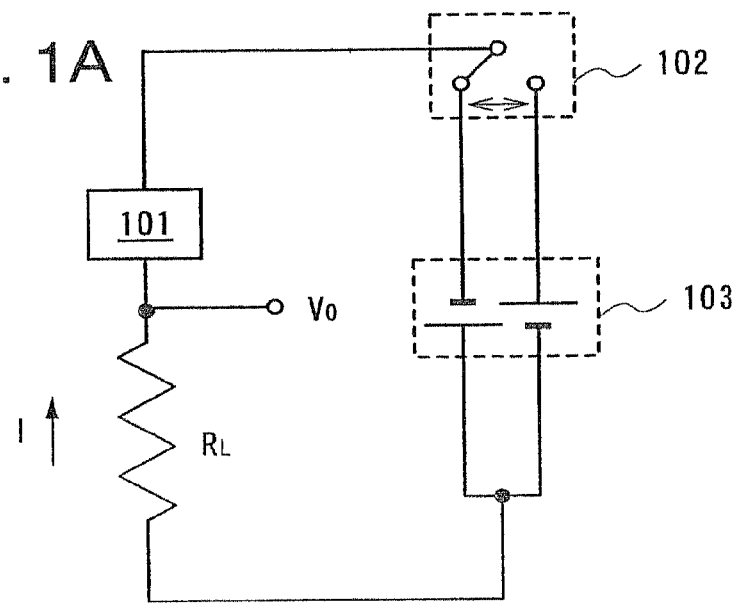
FIGS. 1A and 1B are diagrams each showing a photoelectric conversion device of the present invention.

[Best Mode for Carrying Out the Invention]

Hereinafter, embodiment mode of the present invention will be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention is not limited to the description of the embodiment mode to be given below. Note that in all drawings for describing the embodiment mode, the same reference numerals are used for the same portions or the portions having a similar function, and the repeated description thereof is omitted.

This embodiment mode will be described with reference to FIGS. 1A and 1B, FIG. 2, FIG. 3, FIGS. 4A and 4B, and FIG. 21.

Figure 1B:
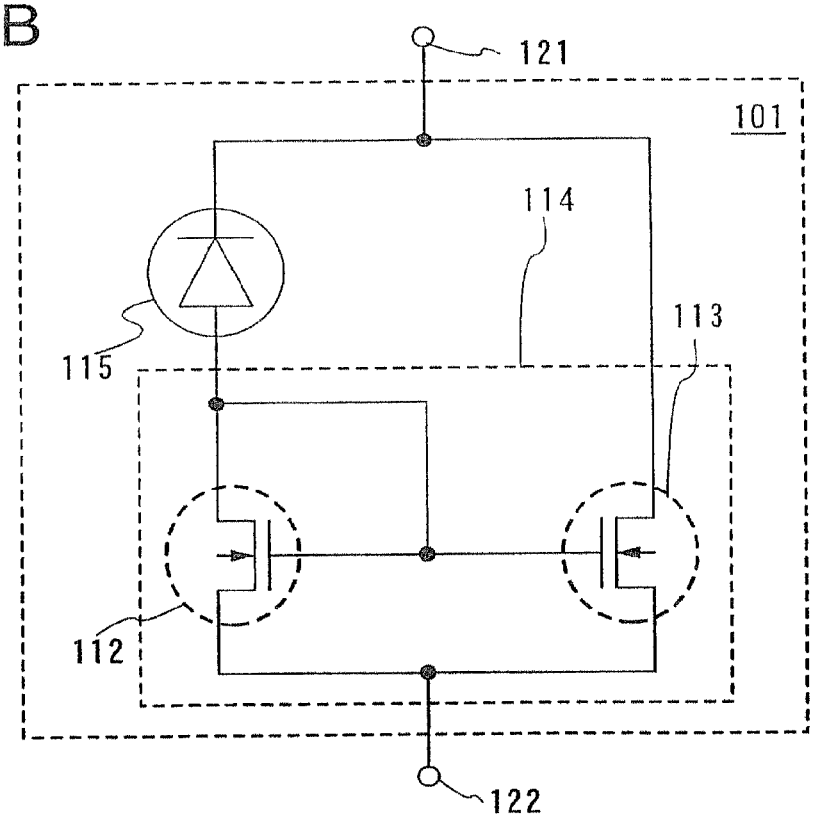

As shown in FIGS. 1A and 1B, a photoelectric conversion device of the present application has a photo IC (Integrated circuit) 101, a power source switching means 102, a power source 103, an output terminal $V_0$, and a connecting resistor $R_L$, and the photo IC (photo integrated circuit) 101 has a thin film integrated circuit constituted by a photoelectric conversion element 115 (a first photo sensor) and a TFT (a second photo sensor). The thin film integrated circuit is constituted by a current mirror circuit 114 including n-channel thin film transistors (TFT) 112 and 113. In addition, the photoelectric conversion element 115 and the current mirror circuit 114 are connected to terminal electrodes 121 and 122, and a photoelectric current is extracted through these terminal electrodes 121 and 122 (FIG. 1B).

The current mirror circuit 114 functions to amplify an output value of the photoelectric conversion element 115 when intensity of incident light is low. In addition, when intensity of incident light is high, the n-channel TFTs 112 and 113 become a photoelectric current source, and a generated photoelectric current is extracted through the terminal electrodes 121 and 122.

Figure 2:
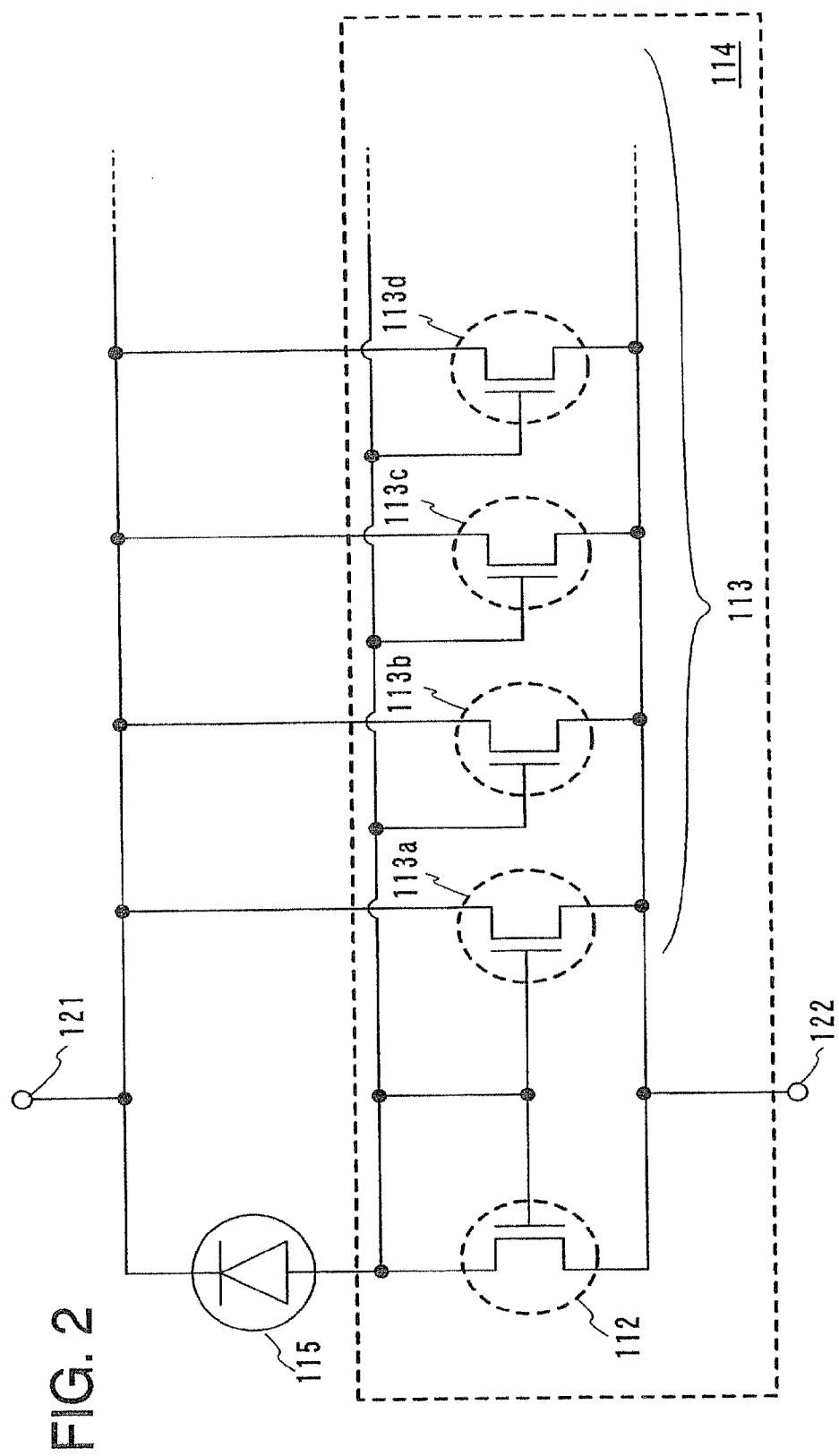
FIG. 2 is a diagram showing one example of a current mirror circuit of the present invention.

In FIG. 1B, two TFTs are illustrated. However, for example, in order to increase an output value by 100 times, one n-channel TFT 112 and 100 n-channel TFTs 113 may be provided (FIG. 2). Note that, in FIG. 2, same portions as those in FIGS. 1A and 1B are denoted by the same reference numerals. In FIG. 2, an n-channel TFT 113 is constituted by 100 n-channel TFTs 113a, 113b, 113c, 113d .... Accordingly, a photoelectric current generated in the photoelectric conversion element 115 is amplified by 100 times to be outputted.

FIG. 1B shows an equivalent circuit diagram of the current mirror circuit 114 using an n-channel TFT; however, only a p-channel TFT may be used instead of the n-channel TFT.

Figure 3:
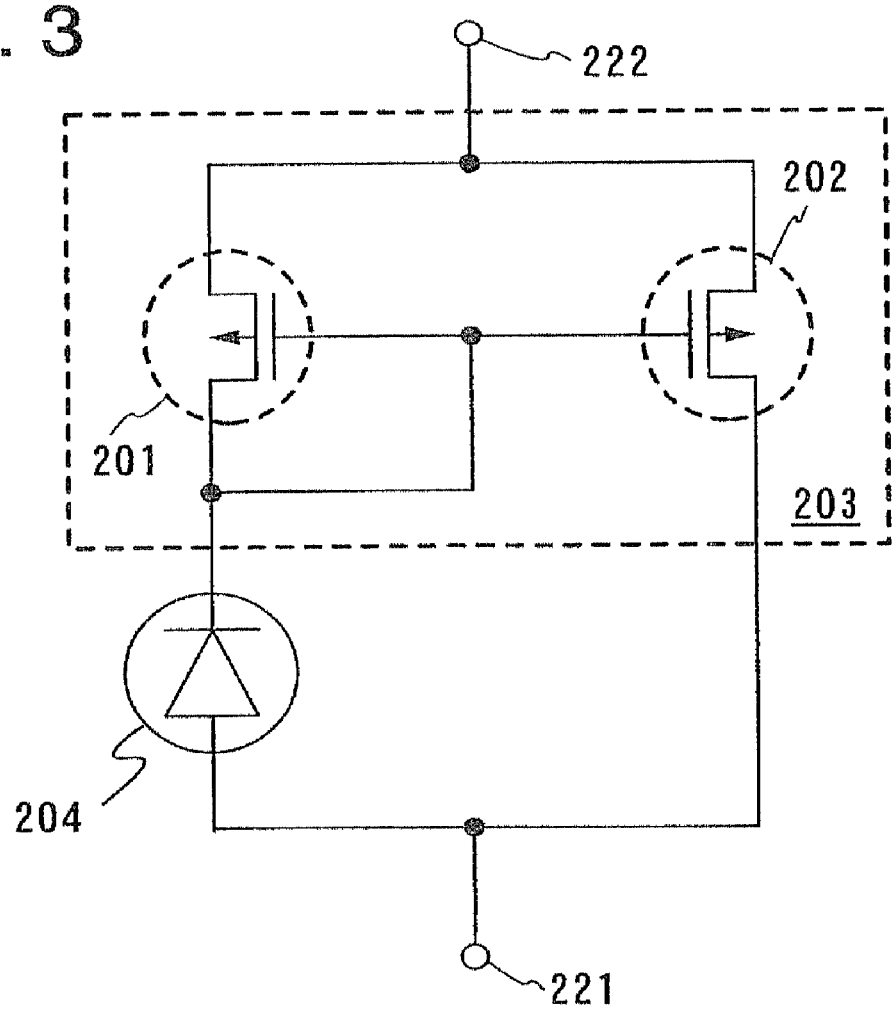
FIG. 3 is a diagram showing one example of a current mirror circuit of the present invention.

Note that, in a case where an amplifier circuit is formed from a p-channel TFT, an equivalent circuit shown in FIG. 3 is obtained. In FIG. 3, terminal electrodes 221 and 222 correspond to the terminal electrodes 121 and 122 of FIG. 1B, respectively, and each of the terminal electrodes 221 and 222 may connect a photoelectric conversion element 204, p-channel TFTs 201 and 202 as shown in FIG. 3.

Figure 4A:
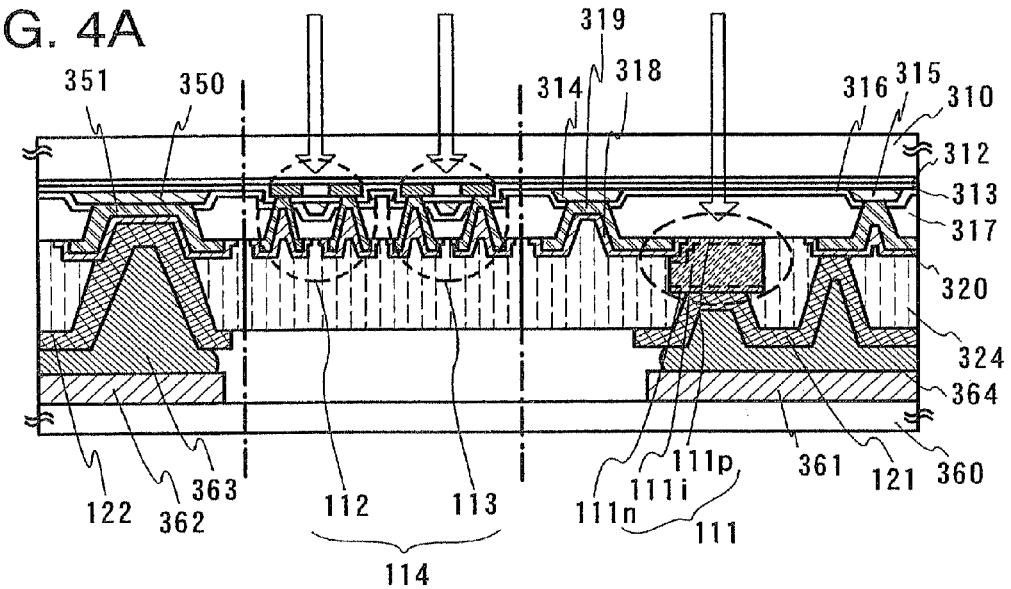
FIGS. 4A and 4B are cross-sectional views of a photoelectric conversion device of the present invention.
Figure 4B:
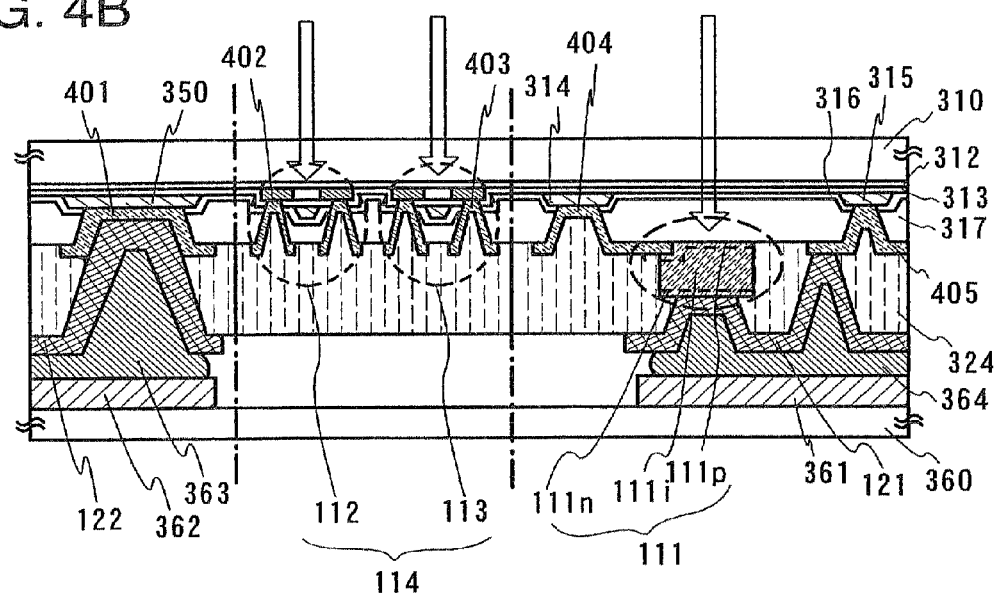

A cross-sectional view of the photo IC 101 of FIG. 1B is shown in FIGS. 4A and 4B.

In FIG. 4A, reference numeral 310 denotes a substrate; 312, a base insulating film; and 313, a gate insulating film. Since received light passes through the substrate 310, the base insulating film 312 and the gate insulating film 313, materials having high light-transmitting property are preferably used as the materials for all of these.

A photoelectric conversion element has a wiring 319; a protective electrode 318; a p-type semiconductor layer 111p, an n-type semiconductor layer 111n and an intrinsic (i-type) semiconductor layer 111i which is sandwiched between the p-type semiconductor layer 111p and the n-type semiconductor layer 111n, each of which is part of a photoelectric conversion layer 111; and a terminal electrode 121.

The p-type semiconductor layer 111p may be formed by depositing a semiamorphous silicon film containing an impurity element belonging to Group 13 of the periodic table, for example, boron (B) by a plasma CVD method.

Note that a semiamorphous semiconductor film includes semiconductor which has an intermediate structure between an amorphous semiconductor and a crystalline semiconductor having a crystalline structure (including a single crystal and a polycrystal). The semiamorphous semiconductor film has a third condition which is stable in terms of free energy, and is a crystalline substance having a short-range order and lattice distortion, and the crystal grain size of 0.5 to 20 nm of which can be dispersed in a non-single crystalline semiconductor film. As for the semiamorphous semiconductor film, raman spectrum thereof is shifted to a wavenumber side lower than 520 cm$^{-1}$, and the diffraction peaks of (111) and (220) that are said to be caused by a Si crystal lattice are observed in X-ray diffraction. In addition, the semiamorphous semiconductor film contains hydrogen or halogen of at least 1 atom % or more to terminate a dangling bond. In the present specification, such a semiconductor film is referred to as a semiamorphous semiconductor (SAS) film for the sake of convenience. Moreover, a noble gas element such as helium, argon, krypton or neon is contained to further promote lattice distortion so that stability is enhanced and a favorable semiamorphous semiconductor film is obtained. Note that a microcrystalline semiconductor film (microcrystal film) is also included in the semiamorphous semiconductor film.

Also, the SAS film can be obtained by glow discharge decomposition of gas containing silicon. As typical gas containing silicon, $SiH_4$ is given, and in addition, $Si_2H_6$, $SiH_2Cl_2$, $SiHCl_3$, $SiCl_4$, $SiF_4$, or the like can also be used. The gas containing silicon is diluted with hydrogen, or gas in which one or more of noble gas elements of helium, argon, krypton and neon are added to hydrogen; thereby, the SAS film can be formed easily. It is preferable that the dilution ratio is set to be in a range of 2 to 1000 times. Moreover, carbide gas such as $CH_4$ or $C_2H_6$, germanium gas such as $GeH_4$ or $GeF_4$, $F_2$, or the like may be mixed in the gas containing silicon to adjust an energy band width to be 1.5 to 2.4 eV or 0.9 to 1.1 eV.

After the p-type semiconductor layer 111p is formed, a semiconductor layer which does not contain an impurity imparting a conductivity type (referred to as an intrinsic semiconductor layer or an i-type semiconductor layer) 111i and the n-type semiconductor layer 111n are sequentially formed. Accordingly, the photoelectric conversion layer 111 including the p-type semiconductor layer 111p, the i-type semiconductor layer 111i, and the n-type semiconductor layer 111n is formed.

Note that, in the present specification, the i-type semiconductor layer indicates a semiconductor layer in which concentration of an impurity imparting p-type or n-type is $1 \times 10^{20}$ cm$^3$ or less, concentration of oxygen and nitrogen is $5 \times 10^{19}$ cm$^{-3}$ or less, and photoconductivity to dark conductivity is 1000 times or more. In addition, 10 to 1000 ppm of boron (B) may also be added to the i-type semiconductor layer.

As the i-type semiconductor layer 111i, for example, a semiamorphous silicon film may be formed by a plasma CVD method. In addition, as the n-type semiconductor layer 111n, a semiamorphous silicon film containing an impurity element belonging to Group 15 of the periodic table, for example, boron (B) may be formed, and alternatively, an impurity element belonging to Group 15 of the periodic table may be introduced after the semiamorphous silicon film is formed.

As the p-type semiconductor layer 111p, the intrinsic semiconductor layer 111i and the n-type semiconductor layer 111n, not only a semiamorphous semiconductor film, but also an amorphous semiconductor film may be used.

Each of the wiring 319, a connection electrode 320, a terminal electrode 351, a source electrode or a drain electrode 341 of a TFT 113 and a source electrode or a drain electrode 342 of a TFT 112 has a stacked layer structure of a refractory metal film and a low resistance metal film (such as an aluminum alloy or pure aluminum). Here, the wiring 319 has a three-layer structure in which a titanium film (Ti film), an aluminum film (Al film) and a Ti film are sequentially stacked.

Moreover, protective electrodes 318, 345, 348, 346 and 347 are formed so as to cover the wiring 319, the connection electrode 320, the terminal electrode 351, the source electrode or the drain electrode 341 of the TFT 113 and the source electrode or the drain electrode 342 of the TFT 112, respectively.

In etching the photoelectric conversion layer 111, the wiring 319 is protected by the protective electrode 318 which covers the wiring 319. As a material for the protective electrode 318, a conductive material having slower etching speed to etching gas (or etchant) for the photoelectric conversion layer 111 than the photoelectric conversion layer is preferable. In addition, a conductive material which does not react with the photoelectric conversion layer 111 to become alloy is preferable as the material for the protective electrode 318. Note that the other protective electrodes 345, 348, 346 and 347 are also formed by the similar material and manufacturing process to the protective electrode 318.

Also, a structure in which the protective electrodes 318, 345, 348, 346 and 347 are not formed over the wiring 319, the connection electrode 320, and the terminal electrode 351 may be employed. A visible light detective portion having such a structure is shown in FIG. 4B. In FIG. 4B, each of a wiring 404, a connection electrode 405, a terminal electrode 401, a source electrode or a drain electrode 402 of a TFT 112, and a source electrode or a drain electrode 403 of a TFT 113 is formed from a single-layer conductive film, and as such a conductive film, a titanium film (Ti film) is preferable. In addition, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), an alloy material or a compound material containing the above element as its main component, or a single-layer film formed from nitride of these elements, for example, titanium nitride, tungsten nitride, tantalum nitride, or molybdenum nitride can be used instead of the titanium film. The number of deposition can be reduced in a manufacturing process by forming the wiring 404, the connection electrode 405, the terminal electrode 401, the source electrode or the drain electrode 402 of the TFT 112, and the source electrode or the drain electrode 403 of the TFT 113 with a single-layer film.

In FIGS. 4A and 4B, an example of a top gate TFT of a structure in which the n-channel TFTs 112 and 113 include one channel formation region (in this specification, referred to as a single gate structure) is shown; however, a structure having a plurality of channel formation regions may also be used to reduce variation in the ON current value. In order to reduce the OFF current value, a lightly doped drain (LDD) region may be provided in the n-channel TFTs 112 and 113. The LDD region is a region to which an impurity element is added at low concentration between a channel formation region and a source region or a drain region which is formed by being added with an impurity element at high concentration. By providing the LDD region, effect to reduce an electric field in the vicinity of the drain region and prevent deterioration due to hot carrier injection can be obtained. In addition, in order to prevent deterioration of the ON current value due to hot carrier, the n-channel TFTs 112 and 113 may have a structure in which an LDD region and a gate electrode are placed so as to be overlapped with each other through a gate insulating film (in the present specification, referred to as a GOLD (Gate-drain Overlapped LDD) structure).

In a case of where a GOLD structure is used, effect to reduce an electric field in the vicinity of a drain region and prevent deterioration due to hot carrier injection is more enhanced than in a case where an LDD region and a gate electrode are not overlapped with each other. By employing such a GOLD structure, electric field intensity in the vicinity of a drain region is reduced and hot carrier injection is prevented, and thereby, it is effective for prevention of deterioration phenomenon.

The TFTs 112 and 113 included in the current mirror circuit 114 may be not only a top gate TFT but also a bottom gate TFT, for example, an inversely staggered TFT. In this case, it is preferable that a gate electrode has a light-transmitting property so as not to prevent received light.

In addition, a wiring 314 is connected to the wiring 319, and also becomes a gate electrode extending to an upper side of the channel formation region of the TFT 113 of the amplifier circuit.

A wiring 315 is connected to the n-type semiconductor layer 111n, and is connected to a drain wiring (also referred to as a drain electrode) or a source wiring (also referred to as a source electrode) of the TFT 112. Reference numerals 316 and 317 denote an insulating film and 320 denotes a connection electrode. Since light which is received passes through the insulating films 316 and 317, a material having high light-transmitting property is preferably used as the materials for all of these. Note that as the insulating film 317, silicon oxide (SiOx) film which is formed by a CVD method is preferably used. When the insulating film 317 is formed of a silicon oxide film which is formed by a CVD method, fixing intensity is improved.

In addition, a terminal electrode 350 is formed by the same process as the wirings 314 and 315, and the terminal electrode 351 is formed by the same process as the wiring 319 and the connection electrode 320.

A terminal electrode 121 is connected to the n-channel semiconductor layer 111n, and is mounted on an electrode 361 of a substrate 360 by a solder 364. A terminal electrode 122 is formed by the same process as the terminal electrode 121, and is mounted on an electrode 362 of the substrate 360 by a solder 363 (FIG. 4A).

In FIGS. 4A and 4B, as shown by arrows in the drawings, light enters island shaped semiconductor regions of the photoelectric conversion layer 111 and the TFTs 112 and 113 from the substrate 310 side. Accordingly, a photoelectric current is generated, and light can be detected.

However, although not shown, light enters not only from the direction of the arrows but also from the opposite side, that is, the substrate 360 side. The incident light passes through a sealing layer 324 and does not pass through the electrode and the wiring that shield light to enter the island-shaped semiconductor regions of the photoelectric conversion layer 111 and TFTs 112 and 113; accordingly, a photoelectric current can be generated.

By using the switching means 102, intensity of light reverses bias to the whole circuit on reaching a predetermined intensity. In a case of simply reversing, a power source may be one kind; however, different bias may be applied by using two different kinds of the power source 103 as shown in FIG. 1A. In addition, an output voltage which is applied to the connecting resistor R is also reversed; therefore, a switching means (not shown) by which the output voltage is reversed may also be used.

Figure 21:
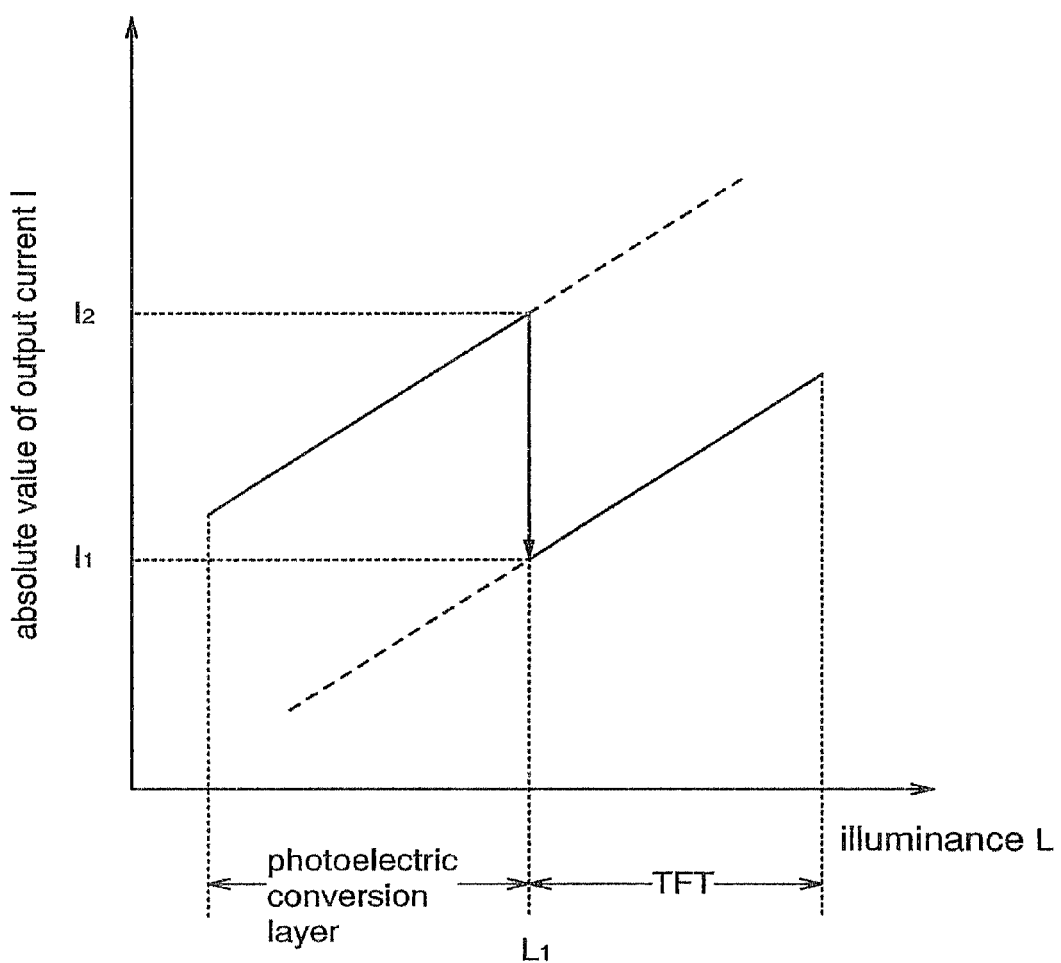
FIG. 21 is a view showing illuminance dependence of an output current in a photoelectric conversion device of the present invention.

A relation between illuminance L and an absolute value of an output current (photoelectric current) I is shown in FIG. 21. Note that the absolute value of the output current I is plotted because an output current direction from a photodiode and an output current direction from a TFT are opposite to each other. In a case where the illuminance is lower than $L_1$, bias may be adjusted so as to detect light which enters the photoelectric conversion layer 111, and in a case where the illuminance is higher than $L_1$, bias may be reversed so as to detect light which enters the TFTs 112 and 113. By the operation as described above, a wide range of illuminance can be detected even when an output current range is small.

[Embodiment 1]

This embodiment will be described with reference to FIG. 19, FIGS. 20A and 20B, and FIG. 22.

Figure 19:
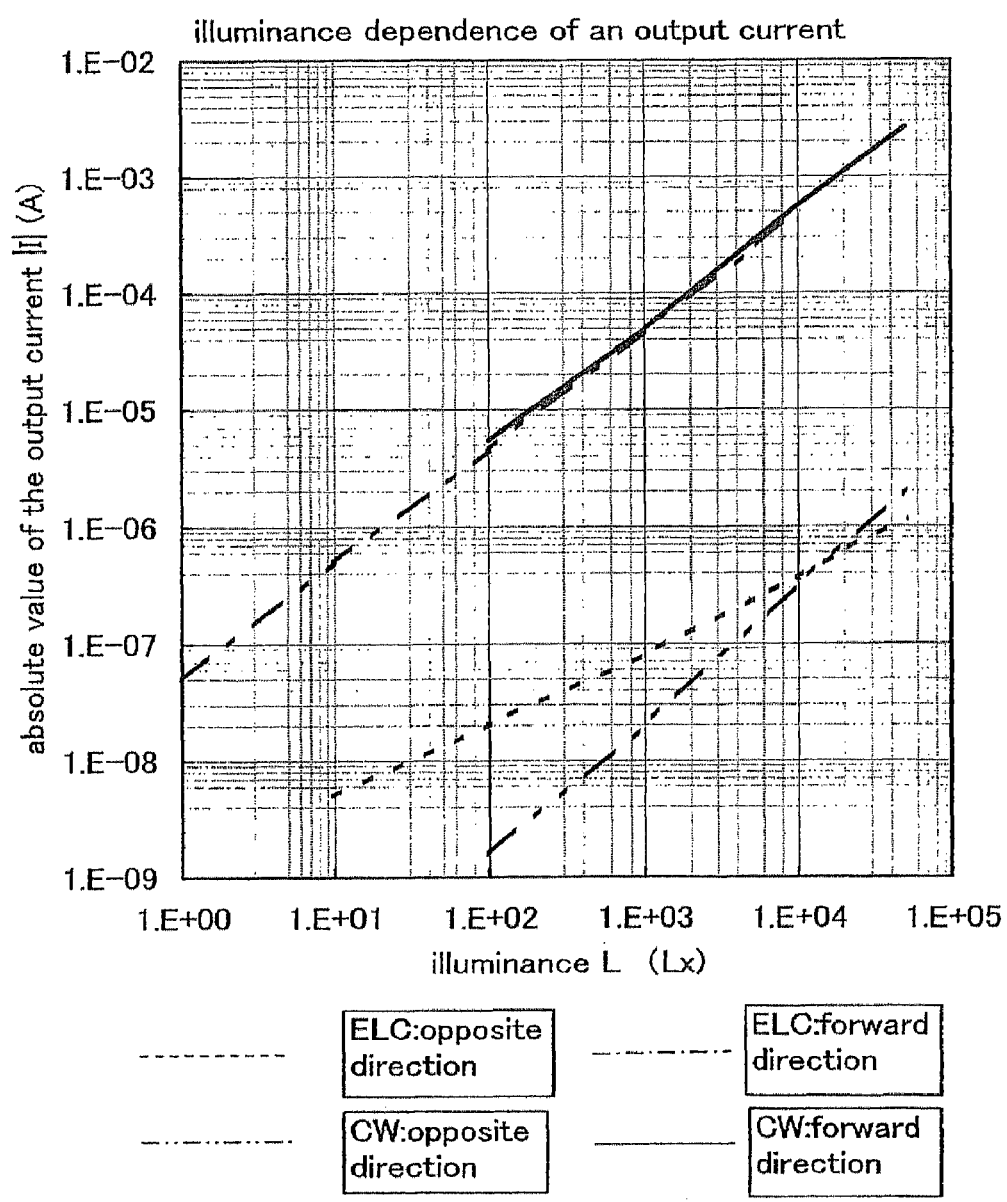
FIG. 19 is a view showing illuminance dependence of an output current in a photoelectric conversion device of the present invention.
Figure 20A:
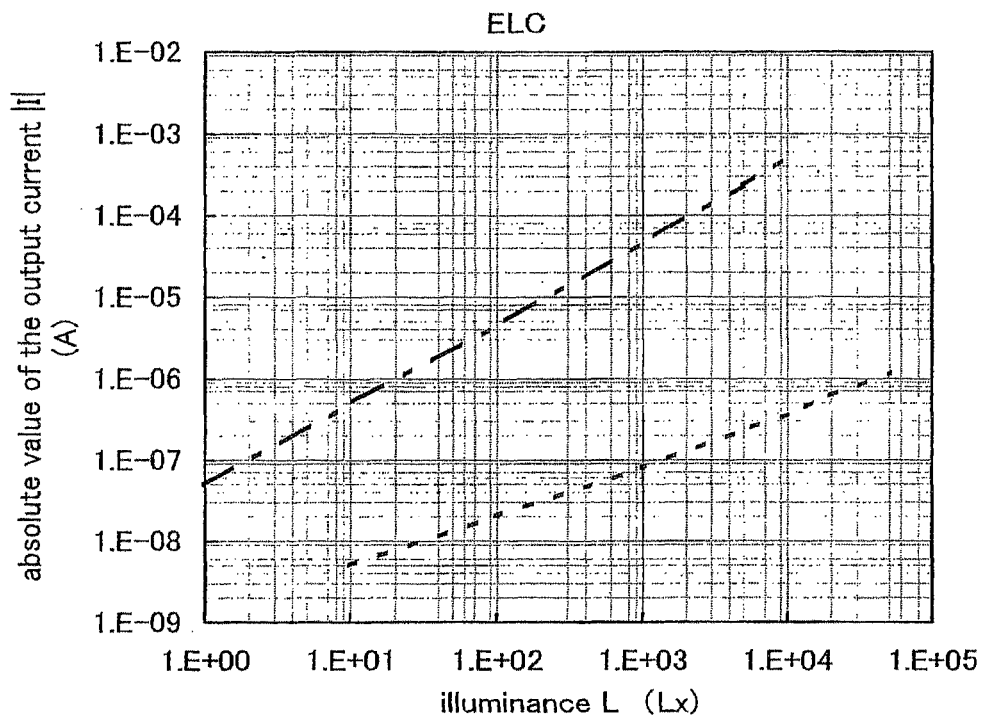
FIGS. 20A and 20B are views each showing illuminance dependence of an output current in a photoelectric conversion device of the present invention.
Figure 20B:
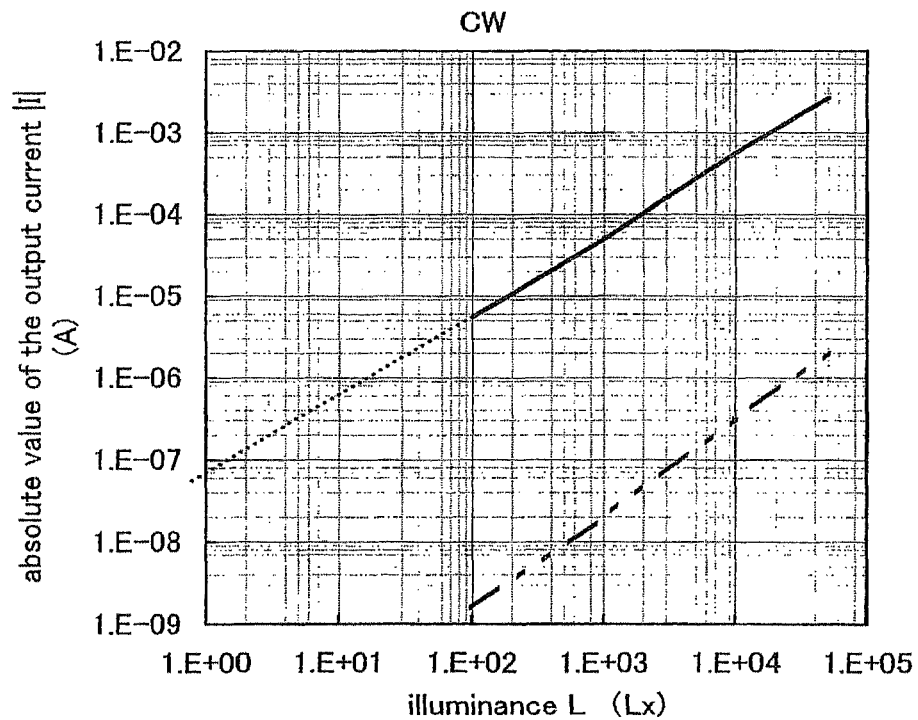

In FIG. 19 and FIGS. 20A and 20B, illuminance dependence of an output current in a photoelectric conversion device manufactured by the present invention is shown.

In FIG. 19, ELC denotes illuminance dependence of an output current in a photoelectric conversion device having a current mirror circuit by a TFT in which an island-shaped semiconductor region is crystallized by an excimer laser. Also, CW denotes illuminance dependence of an output current in a photoelectric conversion device in which a current mirror circuit is formed by a TFT in which an island-shaped semiconductor region is crystallized by a continuous wave laser. In FIGS. 20A and 20B, ELC and CW which are separately plotted are shown. In addition, a forward direction and an opposite direction denote a direction of bias.

A difference in illuminance dependence of an output current between the TFT having an island-shaped semiconductor region which is crystallized by the excimer laser and the TFT having an island-shaped semiconductor region which is crystallized by the continuous wave laser is derived from a difference in crystallinity of the island-shaped semiconductor regions. Also, the illuminance dependence can be changed depending on a channel formation region of a TFT and a threshold value.

In a case of ELC, a range of an output current becomes 20 nA to 5 μA, and a range of detected illuminance becomes 0.5 to 100,000 lx by setting a predetermine intensity to be approximately 100 lx. In a case of using ELC in the circuit of FIG. 1A, by setting the connecting resistor $R_L$ to be 400 kΩ, an output voltage is changed from 0.08 to 2 V, and a digital conversion can be performed with 8 bit (256 grayscale levels).

Figure 24:
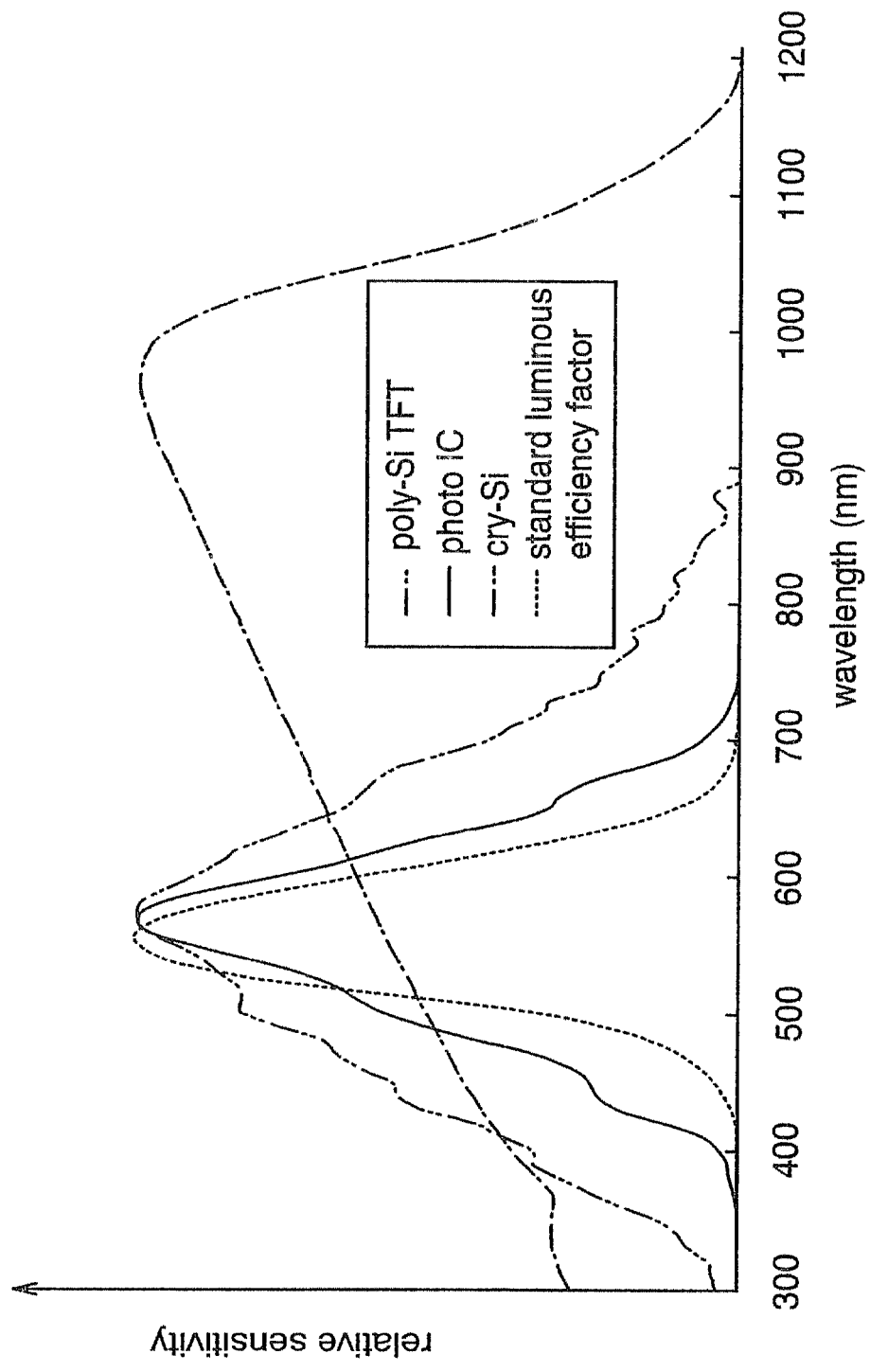
FIG. 24 is a view showing comparisons of relative sensitivity of a photoelectric conversion device of the present invention, relative sensitivity of a TFT using a polycrystalline silicon film, relative sensitivity of single crystal silicon and standard luminous efficiency.

In FIG. 24, a plot in which the photo IC 101 shown in FIGS. 1A and 1B of the present invention, a TFT using a polycrystalline silicon film (hereinafter, referred to as a poly-Si TFT), single crystalline silicon (hereinafter, referred to as cry-Si), and standard luminous efficiency are compared is shown.

In FIG. 24, relative sensitivity of the photo IC of the present invention is shown by a solid line, standard luminous efficiency factor is shown by a dashed line, relative sensitivity of the poly-Si TFT is shown by a line interrupted by two dots, and relative sensitivity of cry-Si is shown by a line interrupted by a single dot. According to FIG. 24, the relative sensitivity of the photo IC of the present invention is extremely close to the standard luminous efficiency factor, in other words, luminosity close to human eyes can be obtained by the photo IC of the present invention.

[Embodiment 2]

This embodiment will be described with reference to FIGS. 4A and 4B, FIGS. 5A to 5D, FIGS. 6A to 6C, and FIGS. 7A to 7C. Note that the same portions as those described in Best Mode for Carrying Out the Invention are denoted by the same reference numerals.

First, an element is formed over a substrate (a first substrate 310). Here, AN 100 which is one of glass substrates is used as the substrate 310.

Subsequently, a silicon oxide film containing nitrogen (with a thickness of 100 nm) which becomes a base insulating film 312 is formed by a plasma CVD method, and a semiconductor film, for example, an amorphous silicon film containing hydrogen (with a thickness of 54 nm) is formed to be stacked thereover without being exposed to the air. Also, the base insulating film 312 may be a stacked layer using a silicon oxide film, a silicon nitride film and a silicon oxide film containing nitrogen. For example, as the base insulating film 312, a film in which a silicon nitride film containing oxygen with a thickness of 50 nm and further a silicon oxide film containing nitrogen with a thickness of 100 nm are stacked may also be formed. Note that a silicon oxide film containing nitrogen or a silicon nitride film functions as a blocking layer which prevents impurity dispersion of alkali metal from a glass substrate.

Next, the above amorphous silicon film is crystallized by a known technique (a solid phase growth method, a laser crystallization method, a crystallization method using catalytic metal, or the like) to form a semiconductor film having a crystal structure (a crystalline semiconductor film), for example, a polycrystalline silicon film. Here, a polycrystalline silicon film is obtained by a crystallization method using catalytic metal. Nickel acetate solution containing 10 ppm of nickel which is converted into weight is applied by a spinner. Note that a method by which a nickel element is diffused over the entire surface by a sputtering method may be used instead of the application. Then, heat treatment is performed and crystallization is performed to form a semiconductor film having a crystalline structure (here, a polycrystalline silicon film). Here, after heat treatment (500° C., an hour), heat treatment for crystallization (550° C., 4 hours) is performed to obtain a polycrystalline silicon film.

Subsequently, an oxide film on the surface of the polycrystalline silicon film is removed with rare hydrofluoric acid or the like. Thereafter, laser light (XeCl: wavelength of 308 nm) irradiation to increase degree of crystallinity and repair a defect which is left in the crystal grain is performed in the air or in an oxygen atmosphere.

As the laser light, an excimer laser having a wavelength of 400 nm or less, or a second harmonic wave or a third harmonic wave of a YAG laser is used. Here, pulse laser light with repetition rate of approximately 10 to 1000 Hz is used, the laser light is converged to be 100 to 500 mJ/cm$^2$ with an optical system, and irradiation is performed with overlap rate of 90 to 95% to scan a silicon film surface. In this embodiment, laser light irradiation with repetition rate of 30 Hz and energy density of 470 mJ/cm$^2$ is performed in the air.

Note that since laser light irradiation is performed in the air or in an oxygen atmosphere, an oxide film is formed on the surface by emitting laser light. Note that an example in which the pulse laser is used is shown in this embodiment; however, a continuous wave laser may also be used, and in order to obtain crystal with large grain size at the time of crystallization of a semiconductor film, it is preferable to use a solid laser which is capable of continuous oscillation and to apply the second to fourth harmonic wave of a fundamental wave. Typically, a second harmonic wave (532 nm) or a third harmonic wave (355 nm) of an Nd:YVO$_4$ laser (a fundamental wave of 1064 nm) may be applied.

In a case of using a continuous wave laser, laser light which is emitted from a continuous wave YVO$_4$ laser of 10 W output is converted into a harmonic wave by a non-linear optical element. Also, there is a method by which YVO$_4$ crystal and a non linear optical element are put in an oscillator and a high harmonic wave is emitted. Then, the laser light having a rectangular shape or an elliptical shape on an irradiated surface is preferably formed by an optical system to be emitted to an object to be processed. At this time, the energy density of approximately 0.01 to 100 MW/cm$^2$ (preferably, 0.1 to 10 MW/cm$^2$) is required. The semiconductor film may be moved at approximately a rate of 10 to 2000 cm/s relatively with respect to the laser light so as to be irradiated.

Subsequently, in addition to the oxide film which is formed by the above laser light irradiation, a barrier layer formed of an oxide film having a thickness of 1 to 5 nm in total is formed by treating the surface with ozone water for 120 seconds. The barrier layer is formed in order to remove a catalytic element which is added for crystallization, for example, nickel (Ni) from the film. Although the barrier layer is formed by using ozone water here, the barrier layer may be formed by stacking an oxide film having a thickness of approximately 1 to 10 nm by a method of oxidizing a surface of a semiconductor film having a crystalline structure by UV-ray irradiation under an oxygen atmosphere; a method of oxidizing a surface of a semiconductor film having a crystalline structure by oxygen plasma treatment; a plasma CVD method; a sputtering method; an evaporation method; or the like. Also, the oxide film which is formed by laser light irradiation may be removed before forming the barrier layer.

Then, an amorphous silicon film containing an argon element which becomes a gettering site is deposited to be 10 to 400 nm thick, here 100 nm thick, is formed over the barrier layer by a sputtering method. Here, the amorphous silicon film containing an argon element is formed under an atmosphere containing an argon element with the use of a silicon target. In a case where an amorphous silicon film containing argon is formed by a plasma CVD method, deposition conditions are as follows: flow ratio of monosilane to argon (SiH$_4$:Ar) is 1:99, deposition pressure is set to be 6.665 Pa, RF power density is set to be 0.087 W/cm$^2$, and deposition temperature is set to be 350° C.

Thereafter, the amorphous silicon film is put in a furnace heated at 650° C. and heat treatment is performed for 3 minutes to remove a catalytic element (gettering). Accordingly, the catalytic element concentration in the semiconductor film having a crystalline structure is reduced. A lamp annealing apparatus may be used instead of the furnace.

Subsequently, the amorphous silicon film containing an argon element, which is a gettering site, is selectively removed by using the barrier layer as an etching stopper, and thereafter, the barrier layer is selectively removed by rare hydrofluoric acid. Note that nickel has a tendency to move to a region having high oxygen concentration at the time of gettering; therefore, it is preferable that the barrier layer formed of an oxide film is removed after gettering.

Note that, in a case where crystallization with the use of a catalytic element is not performed to a semiconductor film, the above steps such as forming a barrier layer, forming the gettering site, heat treatment for gettering, removing the gettering site, and removing the barrier layer are not required.

Figure 5A:
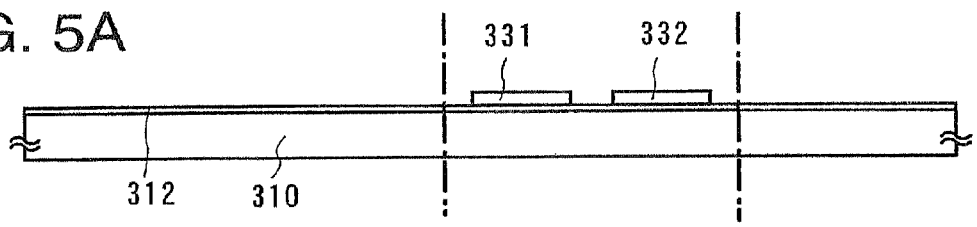
FIGS. 5A to 5D are views each showing a manufacturing process of a photoelectric conversion device of the present invention.

Subsequently, a thin oxide film is formed on the surface of the obtained semiconductor film having a crystalline structure (for example, a crystalline silicon film) with ozone water, and thereafter, a mask formed from a resist is formed using a first photomask and etching treatment into a desired shape is performed to form semiconductor films (in the present specification, referred to as an island-shaped semiconductor region) 331 and 332 which are separated into an island shape (FIG. 5A). After the island-shaped semiconductor region is formed, a mask formed from a resist is removed.

Next, a very small amount of an impurity element (boron or phosphorus) is added in order to control a threshold value of a TFT, if necessary. Here, an ion doping method is used, in which diborane (B$_2$H$_6$) is not separated by mass but excited by plasma.

Subsequently, the oxide film is removed with etchant containing hydrofluoric acid, and at the same time, the surfaces of the island-shaped semiconductor films 331 and 332 are washed. Thereafter, an insulating film containing silicon as its main component which becomes a gate insulating film 313 is formed. Here, a silicon oxide film containing nitrogen (composition ratio Si=32%, O=59%, N=7%, and H=2%) is formed to have a thickness of 115 nm by a plasma CVD method.

Figure 5B:
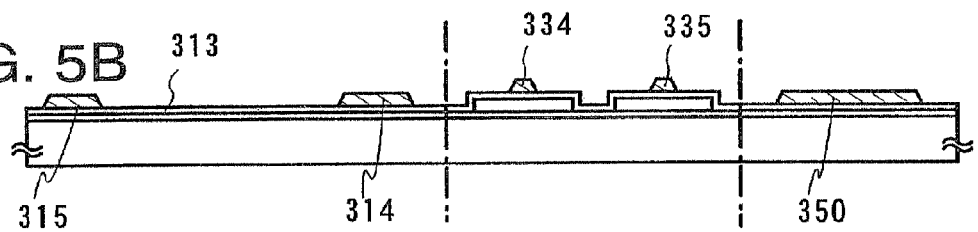
Figure 5C:
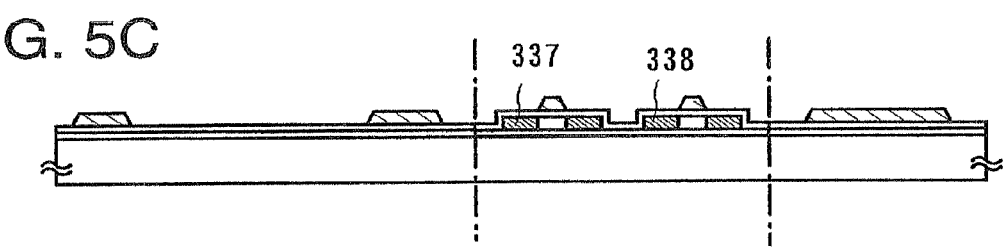

Subsequently, after a metal film is formed over the gate insulating film 313, patterning is performed using a second photomask to form gate electrodes 334 and 335, wirings 314 and 315, and a terminal electrode 350 (FIG. 5B). As the metal film, for example, a film is used, in which tantalum nitride (TaN) and tungsten (W) are stacked to be 30 nm and 370 nm, respectively.

As the gate electrodes 334 and 335, the wirings 314 and 315, and the terminal electrode 350, in addition to the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing the above element as its main component; or a single-layer film formed from nitride thereof, for example, titanium nitride, tungsten nitride, tantalum nitride or molybdenum nitride can be used.

Subsequently, an impurity imparting one conductivity type is introduced to the island-shaped semiconductor regions 331 and 332 to form a source region or a drain region 337 of the TFT 113 and a source region or a drain region 338 of the TFT 112. In this embodiment, an n-channel TFT is formed; therefore, an n-type impurity, for example, phosphorus (P) or arsenic (As) is introduced to the island-shaped semiconductor regions 331 and 332.

Next, a first interlayer insulating film (not shown) containing a silicon oxide film is formed to be 50 nm thick by a CVD method, and thereafter, a process is performed, in which the impurity element added to each of the island-shaped semiconductor regions is activated. This activation process is performed by a rapid thermal annealing method (RTA method) using a lamp light source; an irradiation method of a YAG laser or an excimer laser from the back side; heat treatment using a furnace; or a method which is a combination of any of the foregoing methods.

Then, a second interlayer insulating film 316 including a silicon nitride film containing hydrogen and oxygen is formed, for example, to be 10 nm thick.

Figure 5D:
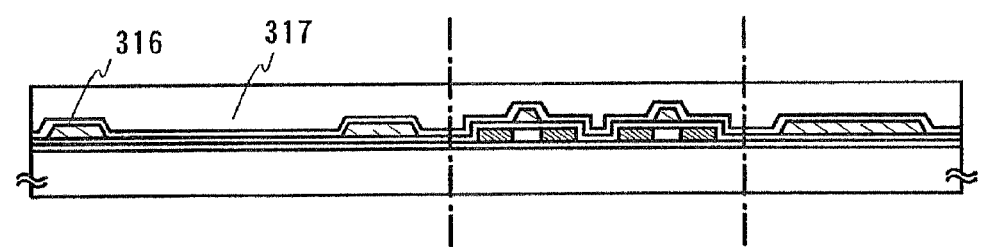

Subsequently, a third interlayer insulating film 317 formed of an insulating material is formed over the second interlayer insulating film 316 (FIG. 5D). An insulating film obtained by a CVD method can be used for the third interlayer insulating film 317. In this embodiment, in order to improve adhesion, a silicon oxide film containing nitrogen is formed to be 900 nm thick as the third interlayer insulating film 317.

Then, heat treatment (heat treatment at 300 to 550° C. for 1 to 12 hours, for example, at 410° C. for 1 hour) is performed to hydrogenate the island-shaped semiconductor film. This process is performed to terminate a dangling bond of the island-shaped semiconductor film by hydrogen contained in the second interlayer insulating film 316. The island-shaped semiconductor film can be hydrogenated regardless of whether or not the gate insulating film 313 is fainted.

In addition, as the third interlayer insulating film 317, an insulating film using siloxane and a stacked structure thereof can also be used. Siloxane is composed of a skeleton structure of a bond of silicon (Si) and oxygen (O). A compound containing at least hydrogen (such as an alkyl group or aromatic hydrocarbon) is used as a substituent. Fluorine may also be used as a substituent. Moreover, fluorine and a compound containing at least hydrogen may be used as a substituent.

In a case where an insulating film using siloxane and a stacked structure thereof are used as the third interlayer insulating film 317, after forming the second interlayer insulating film 316, heat treatment to hydrogenate the island-shaped semiconductor film can be performed, and then, the third interlayer insulating film 317 can be formed.

Subsequently, a mask formed from a resist is formed by using a third photomask, and the first interlayer insulating film, the second interlayer insulating film 316 and the third interlayer insulating film 317, or the gate insulating film 313 is selectively etched to form a contact hole. Then, the mask formed from a resist is removed.

Note that the third interlayer insulating film 317 may be formed if necessary. In a case where the third interlayer insulating film 317 is not formed, the first interlayer insulating film, the second interlayer insulating film 316, and the gate insulating film 313 are selectively etched to form a contact hole after forming the second interlayer insulating film 316.

Next, after forming a metal stacked film by a sputtering method, a mask formed from a resist is formed by using a fourth photomask, and then, the metal film is selectively etched to form a wiring 319, a connection electrode 320, a terminal electrode 351, a source electrode or drain electrode 341 of the TFT 112, and a source electrode or a drain electrode 342 of the TFT 113. Then, the mask formed from a resist is removed. Note that the metal film of this embodiment is a stacked layer in which three layers of a Ti film with a thickness of 100 nm, an Al film containing a very small amount of Si with a thickness of 350 nm, and a Ti film with a thickness of 100 nm are stacked.

In addition, as shown in FIG. 4B, in a case where each of a wiring 404, a connection electrode 405, a terminal electrode 401, a source electrode or a drain electrode 402 of the TFT 112, and a source electrode or a drain electrode 403 of the TFT 113 is formed of a single-layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component, or a single-layer film formed from nitride thereof, for example, titanium nitride, tungsten nitride, tantalum nitride, or molybdenum nitride can be used. The number of deposition can be reduced in the manufacturing process, by forming the wiring 404, the connection electrode 405, the terminal electrode 401, the source electrode or the drain electrode 402 of the TFT 112, and the source electrode or the drain electrode 403 of the TFT 113 with a single-layer film.

The top gate TFTs 112 and 113 using a polycrystalline silicon film can be manufactured by the process described above.

Figure 6A:
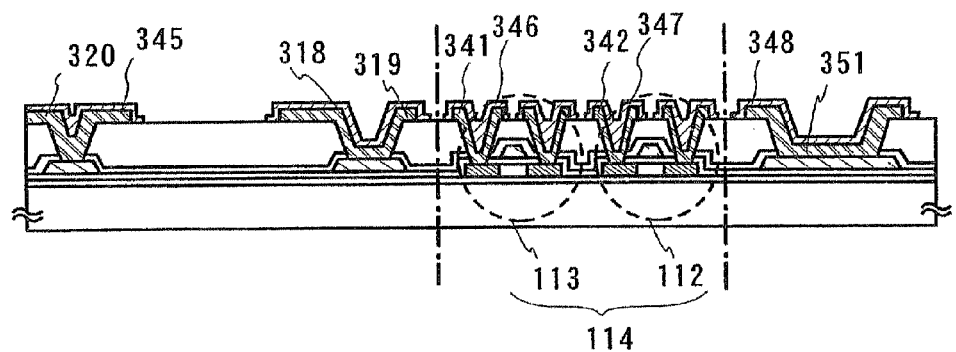
FIGS. 6A to 6C are views each showing a manufacturing process of a photoelectric conversion device of the present invention.

Subsequently, after forming a conductive metal film (such as titanium (Ti) or molybdenum (Mo)) which is not likely to be an alloy by reacting with a photoelectric conversion layer (typically, amorphous silicon) which is formed later, a mask formed from a resist is formed by using a fifth photomask, and then, the conductive metal film is selectively etched to form a protective electrode 318 which covers a wiring 319 (FIG. 6A). Here, a Ti film having a thickness of 200 nm obtained by a sputtering method is used. Note that the connection electrode 320, the terminal electrode 351, and the source electrode or the drain electrode of the TFT are covered with a conductive metal film in the same manner. Therefore, the conductive metal film also covers a side face where the second Al film is exposed in these electrodes, and the conductive metal film also can prevent diffusion of an aluminum atom to the photoelectric conversion layer.

However, in a case where the wiring 319, the connection electrode 320, the terminal electrode 351, the source electrode or the drain electrode 341 of the TFT 112, and the source electrode or the drain electrode 342 of the TFT 113 are formed from a single-layer conductive film, that is, as shown in FIG. 4B, in a case where the wiring 404, the connection electrode 405, the terminal electrode 401, the source electrode or the drain electrode 402 of the TFT 112, and the source electrode or the drain electrode 403 of the TFT 113 are formed instead of these electrodes or wiring as shown in FIG. 4B, the protective electrode 318 is not necessarily be formed.

Subsequently, a photoelectric conversion layer 111 including a p-type semiconductor layer 111p, an i-type semiconductor layer 111i and an n-type semiconductor layer 111n is formed over the third interlayer insulating film 317.

The p-type semiconductor layer 111p may be formed by depositing a semiamorphous silicon film containing an impurity element belonging to Group 13 of the periodic table such as boron (B) by a plasma CVD method.

The wiring 319 and the protective electrode 318 are in contact with the lowest layer of the photoelectric conversion layer 111, in this embodiment, the p-type semiconductor layer 111p.

After the p-type semiconductor layer 111p is formed, the i-type semiconductor layer 111i and the n-type semiconductor layer 111n are sequentially formed. Accordingly, the photoelectric conversion layer 111 including the p-type semiconductor layer 111p, the i-type semiconductor layer 111i and the n-type semiconductor film 111n is formed.

As the i-type semiconductor layer 111i, for example, a semiamorphous silicon film is formed by a plasma CVD method. In addition, as the n-type semiconductor layer 111n, a semiamorphous silicon film containing an impurity element belonging to Group 15of the periodic table, for example, phosphorus (P) may be formed, or after forming a semiamorphous silicon film, an impurity element belonging to Group 15 of the periodic table may also be introduced.

In addition, as the p-type semiconductor layer 111p, the intrinsic semiconductor layer 111i and the n-type semiconductor layer 111n, not only a semiamorphous semiconductor film but also an amorphous semiconductor film may be used.

Figure 6B:
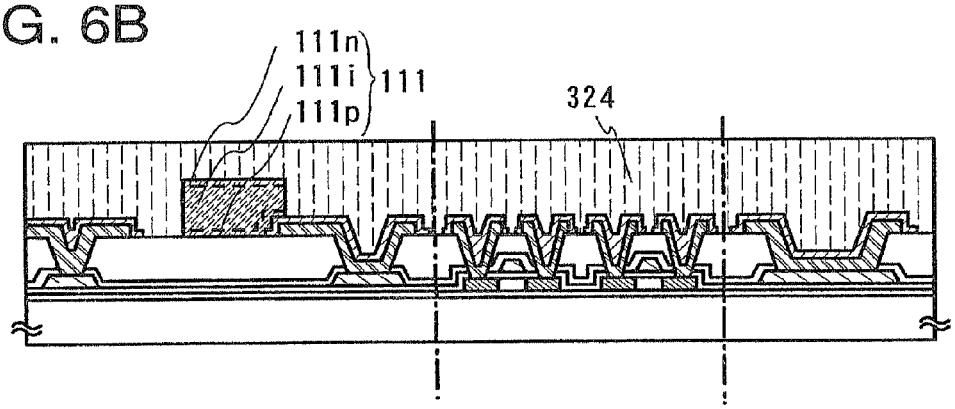

Next, a sealing layer 324 formed from an insulating material (for example, an inorganic insulating film containing silicon) is formed to have a thickness of 1 to 30 μm over the entire surface to obtain a state shown in FIG. 6B. Here, as an insulating material film, a silicon oxide film containing nitrogen with a thickness of 1 μm is formed by a CVD method. Improvement in adhesiveness is attempted by using an insulating film formed by a CVD method.

Subsequently, after the sealing layer 324 is etched to provide an opening, terminal electrodes 121 and 122 are formed by a sputtering method. Each of the terminal electrodes 121 and 122 is a stacked layer of a titanium film (Ti film) (100 nm), a nickel film (Ni film) (300 nm), and a gold film (Au film) (50 nm). The thus obtained terminal electrode 121 and the terminal electrode 122 have fixing intensity of more than 5N, which is sufficient fixing intensity as a terminal electrode.

Figure 6C:
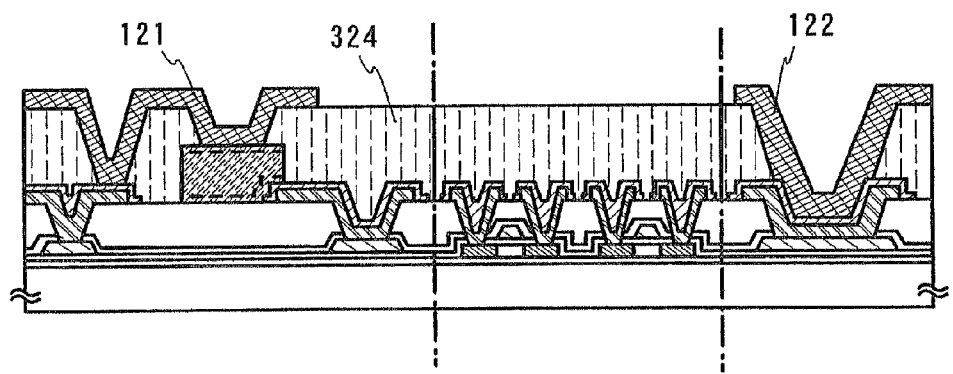

By the process described above, the terminal electrode 121 and the terminal electrode 122 which can be connected by the solder are formed, and a structure shown in FIG. 6C can be obtained.

Next, a plurality of light detective portion chips is taken out by cutting separately. A large amount of light detective portion chips (2 mm×1.5 mm) can be manufactured from one large-sized substrate (for example, 600 cm×720 cm).

A cross-sectional view of one taken light detective portion chip (2 mm×1.5 mm) is shown in FIG. 7A, a bottom view thereof is shown in FIG. 7B, and a top view thereof is shown in FIG. 7C. In FIGS. 7A to 7C, the same portions as those in FIGS. 4A to 4C, FIGS. 5A to 5C, and FIGS. 6A to 6C are denoted by the same reference numerals. Note that the total thickness including thicknesses of a substrate 310, an element formation region 410, a terminal electrode 121 and a terminal electrode 122 is 0.8±0.05 mm in FIG. 17A.

In addition, in order to reduce the total thickness of the light detective portion chip, the substrate 310 may be ground to be thinned by CMP treatment or the like, and then, cut separately by a dicer to take out a plurality of light detective portion chips.

In FIG. 7B, each electrode size of the terminal electrodes 121 and 122 is 0.6 mm×1.1 mm, and the interval between the electrodes is 0.4 mm. In addition, in FIG. 7C, the area of a light receiving portion 411 is 1.57 mm$^2$. Moreover, an amplifier circuit portion 412 is provided with approximately 100 TFTs.

Lastly, the obtained light detective portion chip is mounted on a mounting surface of a substrate 360. Note that in order to connect the terminal electrode 121 to an electrode 361 and the terminal electrode 122 to an electrode 362, solders 364 and 363 are respectively used. The solders are formed in advance by a screen printing method or the like over the electrodes 361 and 362 of the substrate 360. Then, after the solder and the terminal electrode are made in an abutted state, solder reflow treatment is performed to mount the light sensor chip on the substrate. The solder reflow treatment is performed at approximately 255 to 265° C. for about 10 seconds in an inert gas atmosphere, for example. Alternatively, a bump formed from metal (such as gold or silver), a bump formed from a conductive resin, or the like can be used instead of the solder. Further alternatively, a lead-free solder may be used for mounting in consideration of environmental problems.

Note that this embodiment can be combined with any description in Embodiment Mode and Embodiment 1.

[Embodiment 3]

In this embodiment, an example in which an amplifier circuit is formed from a p-channel TFT will be described with reference to FIG. 3 and FIGS. 8A and 8B. Note that the same portions as those in Embodiment Mode and Embodiment 2 are denoted by the same reference numerals, and the amplifier circuit may be formed on the basis of the manufacturing process described in Embodiment Mode and Embodiment 2.

In a case where an amplifier circuit, for example, a current mirror circuit 203 is formed from p-channel TFTs 201 and 202, a p-type impurity, for example, boron (B) may be substituted for the impurity imparting one conductivity type to the island-shaped semiconductor region in Embodiment Mode and Embodiment 2.

Figure 8A:
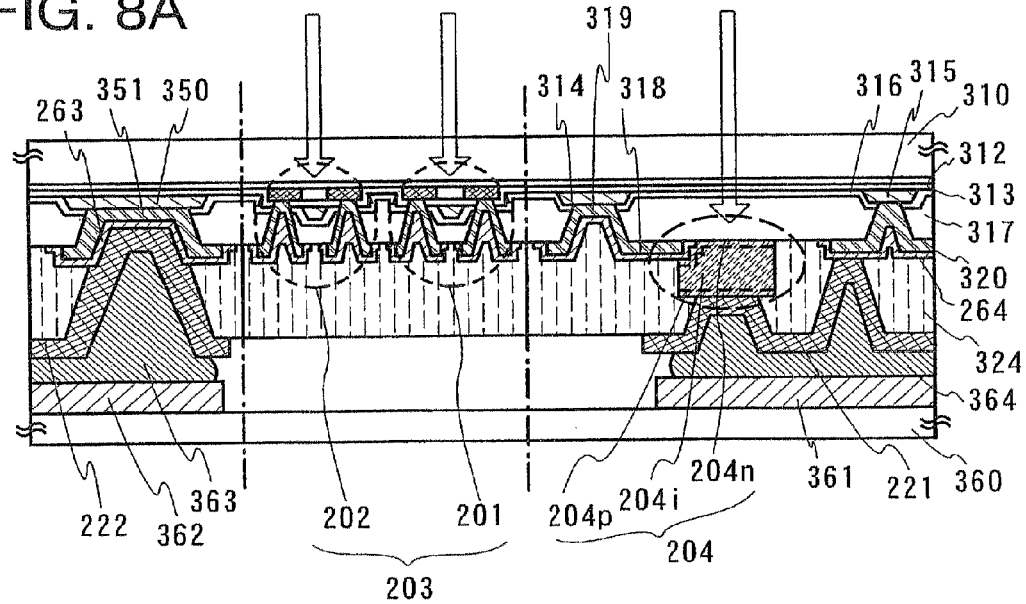
FIGS. 8A and 8B are cross-sectional views of a photoelectric conversion device of the present invention.
Figure 8B:
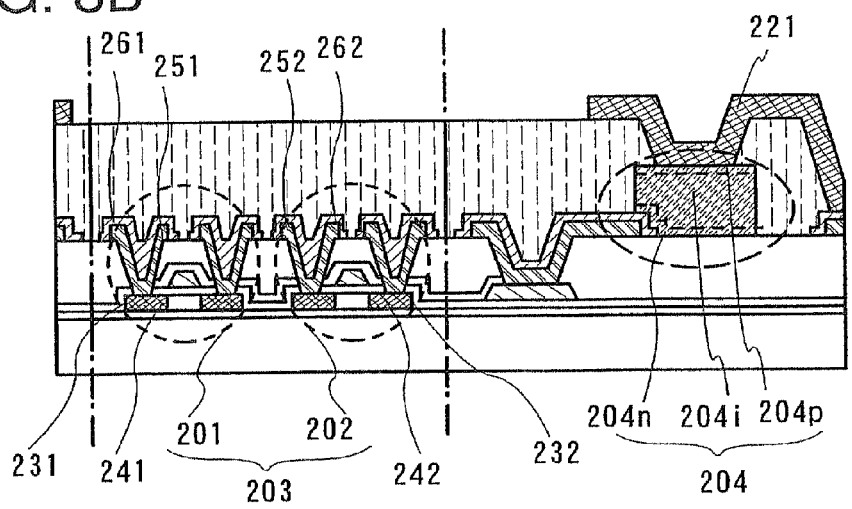

A view of an equivalent circuit of a light detective portion of this embodiment in which the current mirror circuit 203 is formed from the p-channel TFTs 201 and 202 is shown in FIG. 3, and a cross-sectional view thereof is shown in FIGS. 8A and 8B. Note that FIG. 8B is a view in which the vicinity of the p-channel TFTs 201 and 202 and a photoelectric conversion layer 204 of FIG. 8A is enlarged.

In FIG. 3 and FIGS. 8A and 8B, terminal electrodes 221 and 222 are connected to the photoelectric conversion layer 204 and the p-channel TFTs 201 and 202, respectively. The p-channel TFT 201 is electrically connected to an electrode at an anode side of the photoelectric conversion layer 204. After an n-type semiconductor layer 204n, an i-type semiconductor layer 204i, and a p-type semiconductor layer 204-p are sequentially stacked over a second electrode (the electrode at the anode side) which is connected to the p-channel TFTs 201, a first electrode (an electrode at a cathode side) may be formed; accordingly, the photoelectric conversion layer 204 is formed.

In addition, a photoelectric conversion layer in which the stacking order is reversed may also be used. After the p-type semiconductor layer, the i-type semiconductor layer and the n-type semiconductor layer are sequentially stacked over the first electrode (the electrode at the cathode side), the second electrode (the electrode at the anode side) which is connected to the p-channel TFT 201 may be formed and the terminal electrode at the cathode side which is connected to the first electrode may also be formed.

As shown in FIG. 8B, a p-type impurity, for example, boron (B) is introduced to an island-shaped semiconductor region 231 of the p-channel TFT 201 and an island-shaped semiconductor region 232 of the p-channel TFT 202. A source region or drain region 241 is formed in the p-channel TFT 201, and a source region or a drain region 242 is formed in the p-channel TFT 202.

In FIGS. 8A and 8B, instead of a wiring 319 and a protective electrode thereof 318; a connection electrode 320 and a protective electrode thereof 264; a terminal electrode 351 and a protective electrode thereof 263; a source electrode or a drain electrode 251 of the TFT 201 and a protective electrode thereof 261; and a source electrode or a drain electrode 252 of the TFT 202 and a protective electrode thereof 262, each wiring and electrode may also be formed by using a single-layer conductive film in the same manner as the wiring 404, the connection electrode 405, the terminal electrode 401, the source electrode or the drain electrode 402 of the TFT 112 and the source electrode or the drain electrode 403 of the TFT 113 shown in FIG. 4B.

Note that this embodiment mode can be combined with any description in Embodiment Mode, Embodiment 1 and Embodiment 2.

[Embodiment 4]

In this embodiment, an example of a light detective portion in which an amplifier circuit is formed by using a bottom gate TFT and a manufacturing method thereof will be described with reference to FIGS. 9A to 9E, FIGS. 10A to 10C and FIG. 11. Note that the same portions as those in Embodiment Mode, Embodiment Mode 2 and Embodiment Mode 3 are denoted by the same reference numerals.

Figure 9A:
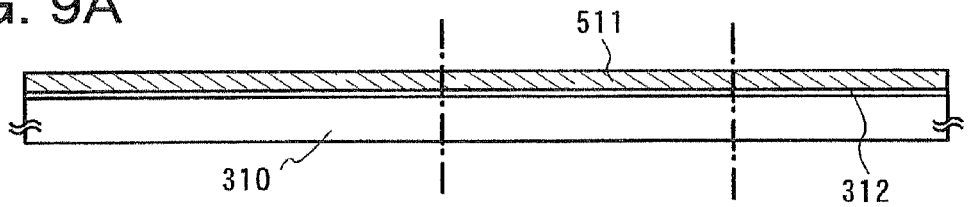
FIGS. 9A to 9E are views each showing a manufacturing process of a photoelectric conversion device of the present invention.

First, a base insulating film 312 and a metal film 511 are formed over a substrate 310 (FIG. 9A). As the metal film 511, in this embodiment, tantalum nitride (TaN) having a thickness of 30 nm and tungsten (W) having a thickness of 370 nm are stacked is used, for example.

In addition, as the metal film 511, in addition to the above film, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) and copper (Cu), or an alloy material or a compound material containing the above element as its main component, or a single-layer film formed from nitride thereof such as titanium nitride, tungsten nitride, tantalum nitride, or molybdenum nitride can be used.

Note that the metal film 511 may be formed directly on the substrate 310 without forming the base insulating film 312 on the substrate 310.

Figure 9B:
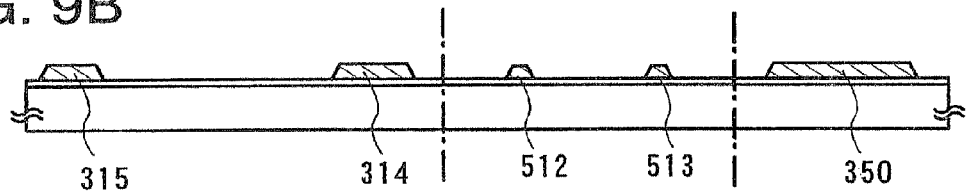

Next, the metal film 511 is patterned to form gate electrodes 512 and 513, wirings 314 and 315 and a terminal electrode 350 (FIG. 9B).

Subsequently, a gate insulating film 514 which covers the gate electrodes 512 and 513, the wirings 314 and 315 and the terminal electrode 350 is formed. In this embodiment, the gate insulating film 514 is formed by using an insulating film containing silicon as its main component, for example, a silicon oxide film containing nitrogen (composition ratio Si=32%, O=59%, N=7%, H=2%) having a thickness of 115 nm by a plasma CVD method.

Figure 9C:
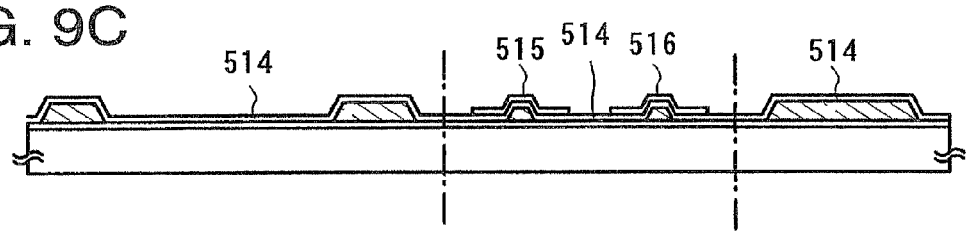

Next, island-shaped semiconductor regions 515 and 516 are formed over the gate insulating film 514. The island-shaped semiconductor regions 515 and 516 may be formed by the similar material and manufacturing process to those of the island-shaped semiconductor regions 331 and 332 described in Embodiment 2 (FIG. 9C).

Figure 9D:
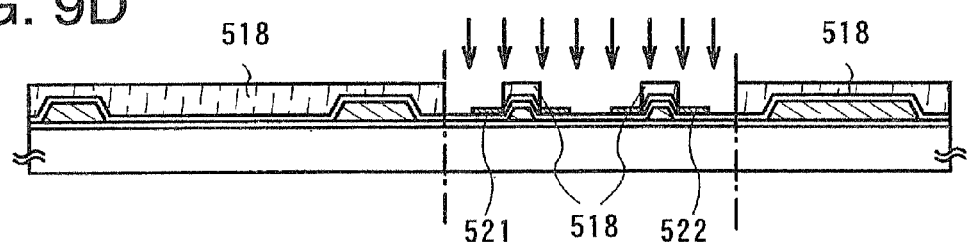

After the island-shaped semiconductor regions 515 and 516 are formed, a mask 518 is formed covering portions except for regions which sequentially becomes a source region or a drain region 521 of a TFT 502 and a source region or a drain region 522 of a TFT 501 to introduce an impurity imparting one conductivity type (FIG. 9D). As the one conductivity type impurity, in a case of forming an n-channel TFT, phosphorus (P) or arsenic (As) may be used as an n-type impurity, whereas in a case of forming a p-channel TFT, boron (B) may be used as a p-type impurity. In this embodiment, phosphorus which is an n-type impurity is introduced to the island-shaped semiconductor regions 515 and 516, and then, a channel formation region is formed between the source region or the drain region 521 and the source region or the drain region 521 of the TFT 502, and a channel formation region is formed between the source region or the drain region 522 and a source region or a drain region 522 of the TFT 501.

Figure 9E:
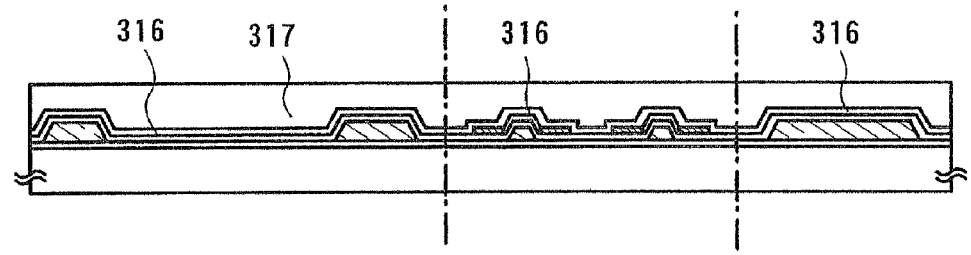

Next, the mask 518 is removed, and a first interlayer insulating film which is not shown, a second interlayer insulating film 316 and a third interlayer insulating film 317 are formed (FIG. 9E). A material and a manufacturing process of the first interlayer insulating film, the second interlayer insulating film 316 and the third interlayer insulating film 317 is based on the description in Embodiment Mode 2.

Contact holes are formed in the first interlayer insulating film, the second interlayer insulating film 316 and the third interlayer insulating film 317, and a metal film is formed, and further, the metal film is selectively etched to form a wiring 319, a connection electrode 320, a terminal electrode 351, a source electrode or a drain electrode 531 of the TFT 502 and a source electrode or a drain electrode 532 of the TFT 501. Then, the mask formed from a resist is removed. Note that the metal film of this embodiment is a film in which 3 layers of a Ti film having a thickness of 100 nm, an Al film containing a very small amount of silicon having a thickness of 350 nm and a Ti film having a thickness of 100 nm are stacked.

In addition, instead of the wiring 319 and a protective electrode thereof 318; the connection electrode 320 and a protective electrode thereof 533; the terminal electrode 351 and a protective electrode thereof 538; the source electrode or the drain electrode 531 of the TFT 502 and a protective electrode thereof 536; and a source electrode or a drain electrode 252 of a TFT 202 and a protective electrode thereof 537, each wiring and electrode may be formed by using a single-layer conductive film, in the same manner as the wiring 404, the connection electrode 405, the terminal electrode 401, the source electrode or the drain electrode 402 of the TFT 112 and the source electrode or the drain electrode 403 of the TFT 113 in FIG. 4B.

Through the above process, bottom gate TFTs 501 and 502 can be manufactured.

Figure 10A:
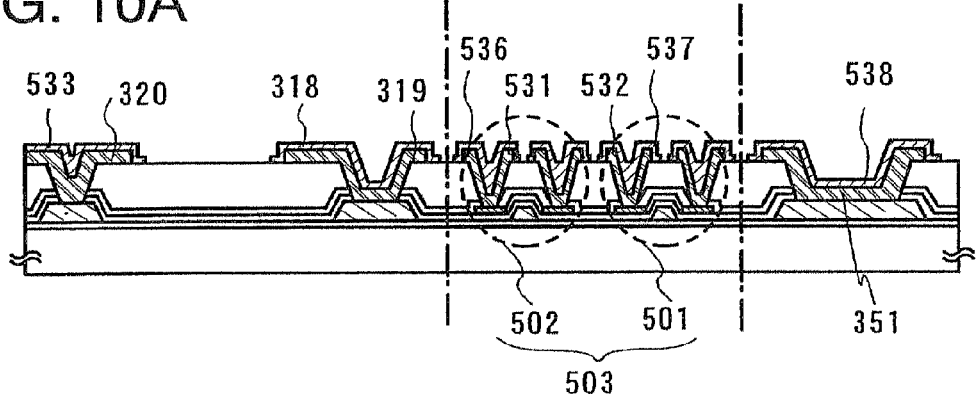
FIGS. 10A to 10C are views each showing a manufacturing process of a photoelectric conversion device of the present invention.
Figure 10B:
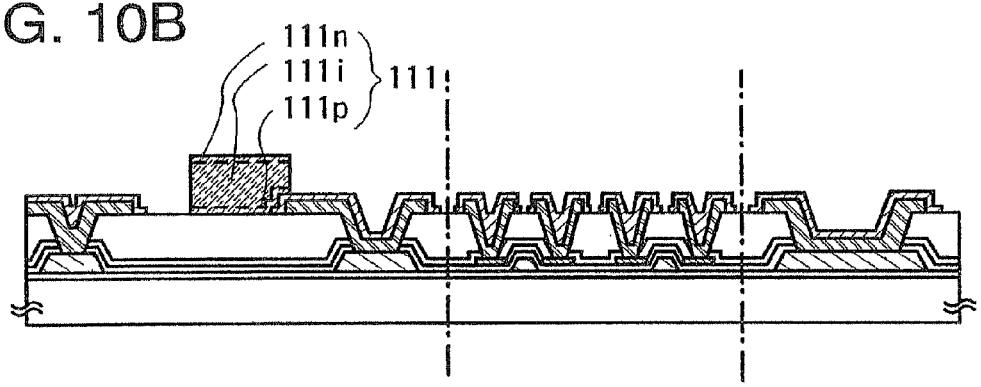

Subsequently, a photoelectric conversion layer 111 including a p-type semiconductor layer 111p, an i-type semiconductor layer 111*i* and an n-type semiconductor layer 111*n* is formed over the third interlayer insulating film 317 (FIG. 10B). Embodiment Mode and Embodiment 2 may be referred for a material and a manufacturing process of the photoelectric conversion layer 111.

Figure 10C:
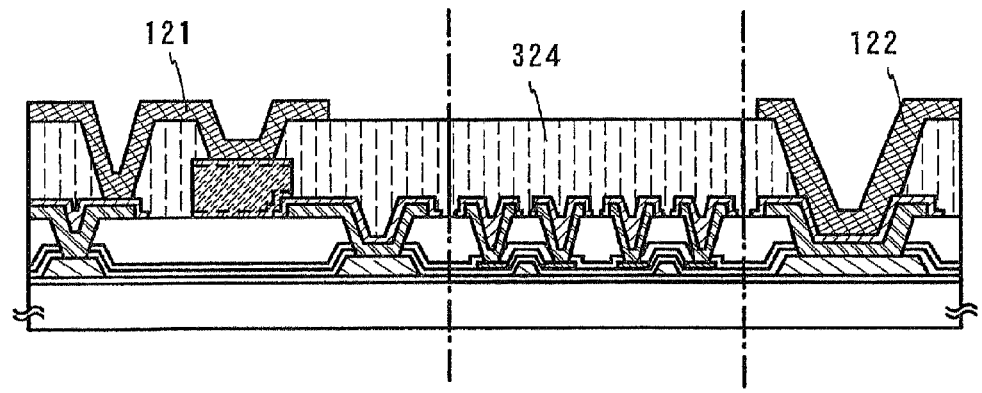

Next, a sealing layer 324 and terminal electrodes 121 and 122 are formed (FIG. 10C). The terminal electrode 121 is connected to the n-type semiconductor layer 111*n*, and the terminal electrode 122 is formed by the same process as the terminal electrode 121.

Moreover, a substrate 360 having electrodes 361 and 362 is mounted by solders 364 and 363. Note that the electrode 361 over the substrate 360 is mounted on the terminal electrode 121 by the solder 364. In addition, the electrode 362 over the substrate 360 is mounted on the terminal electrode 122 by the solder 363.

Figure 11:
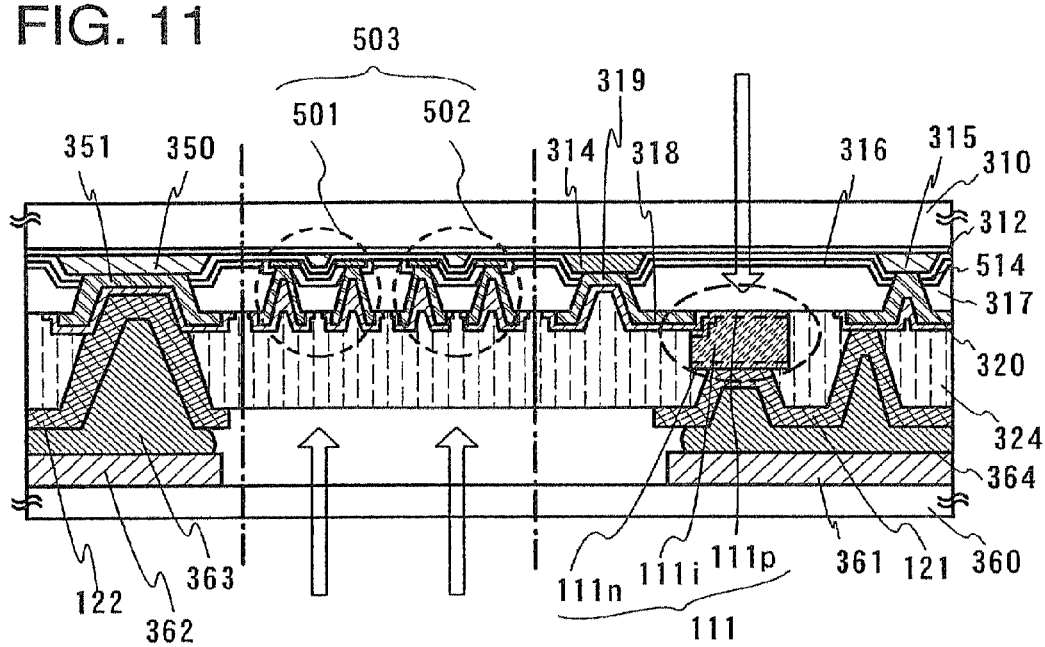
FIG. 11 is a cross-sectional view of a photoelectric conversion device of the present invention.

In a light detective portion shown in FIG. 11, light which enters a photoelectric conversion layer 111 enters mainly from a substrate 310 site, whereas light which enters inversely staggered TFTs 501 and 502 enters mainly from the substrate 360 side. In addition, by forming a gate electrode with a transparent conductive film, light which enters from the substrate side can be detected.

Note that this embodiment can be combined with any description in Embodiment Mode and Embodiments 1 to 3.

[Embodiment 5]

In this embodiment, an example in which a housing is formed to a photoelectric conversion device of the present invention to control an incidence direction of light will be described with reference to FIGS. 12A and 12B and FIGS. 13A and 13B.

Figure 12A:
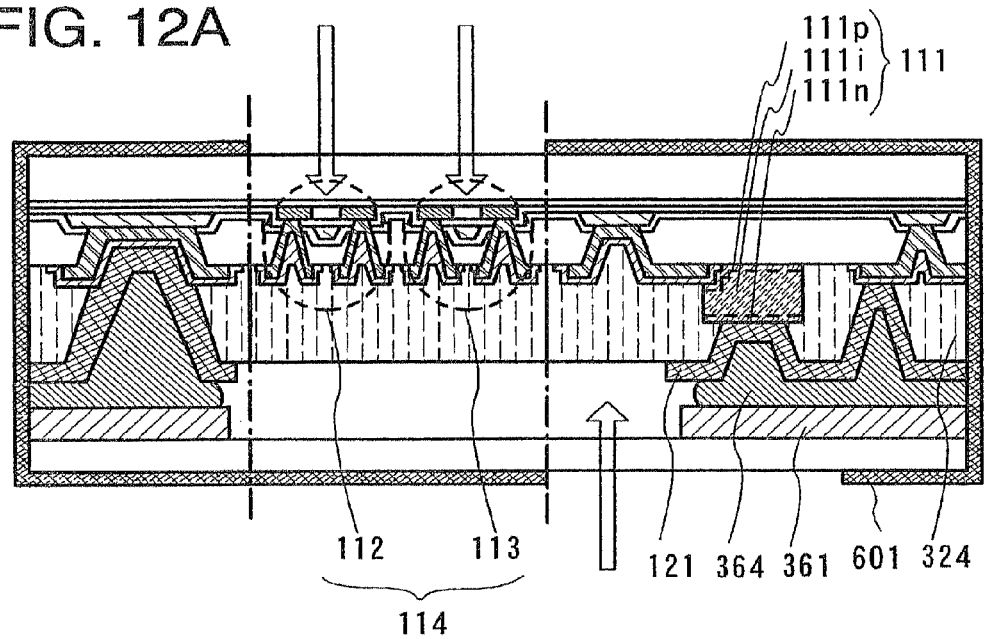
FIGS. 12A and 12B are cross-sectional views of a photoelectric conversion device of the present invention.

In FIG. 12A, a housing 601 is formed to the photoelectric conversion device of FIG. 4A so that light which enters a photoelectric conversion layer 111 enters not from a substrate 310 side but from a substrate 360 side. The housing 601 is provided with openings that are formed in a region where TFTs 112 and 113 are formed at the substrate 310 side and a region where the photoelectric conversion layer 111 is formed at the substrate 360 side.

In FIG. 12A, there are a terminal electrode 121, an electrode 361 and a solder 364; however, light which enters from the substrate 360 side enters diagonally through a sealing layer 324. Accordingly, a photoelectric current can be generated and light can be detected.

In addition, any material can be used for the housing 601 and housings 602 to 604 that are described below as long as it has function of shielding light. For example, a resin material or the like having a metal material or a black pigment may be used.

Figure 12B:
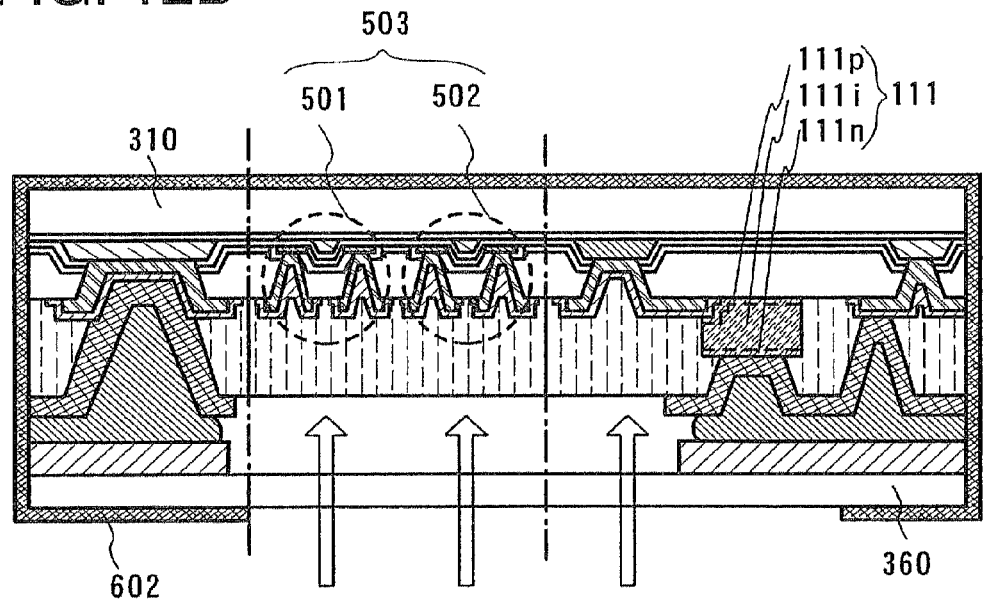

In FIG. 12B, the housing 602 is formed to the light detective portion of FIG. 11 so that light which enters the photoelectric conversion layer 111 enters not from the substrate 310 side but from the substrate 360 side. The housing 602 is provided with an opening which is formed in a region where TFTs 501 and 502 are formed and a region where the photoelectric conversion layer 111 is formed at the substrate 360 side.

Also in FIG. 12B, similarly to FIG. 12A, light which enters from the substrate 360 side enters diagonally the photoelectric conversion layer 111 through the sealing layer 324. Accordingly, a photoelectric current can be generated and light can be detected.

Figure 13A:
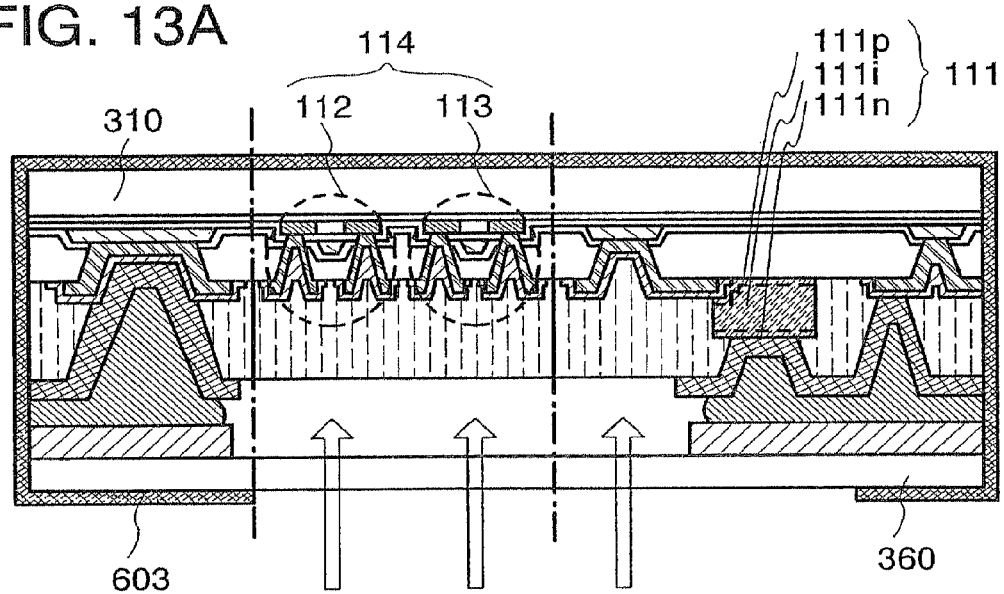
FIGS. 13A and 13B are cross-sectional views of a photoelectric conversion device of the present invention.

In FIG. 13A, a housing 603 is formed to the light detective portion of FIG. 4A so that light which enters a photoelectric conversion portion 111 and TFTs 112 and 113 enters not from the substrate 310 side but from the substrate 360 side. The housing 603 is provided with an opening which is formed in a region where 111 is 501 and 502 are formed and a region where the photoelectric conversion layer 111 is formed at the substrate 360 side.

In FIG. 13A, there is a gate electrode between incident light and an island-shaped semiconductor region in each of the TFTs 112 and 113; however, light which does not pass through the gate electrode among light which enters from the substrate 360 side enters the island-shaped semiconductor regions of the TFTs 112 and 113. In addition, light which enters from the substrate 360 side enters diagonally the photoelectric conversion layer 111 thorough a sealing layer 324. Accordingly, a photoelectric current can be generated and light can be detected.

Figure 13B:
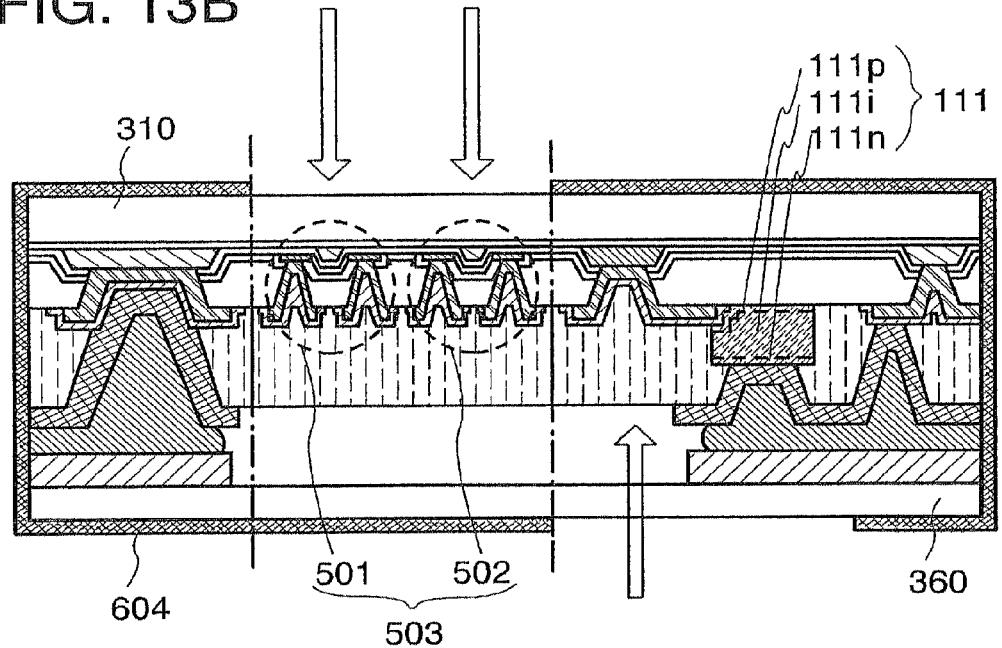

In FIG. 13B, a housing 604 is formed to the light detective portion of FIG. 11 so that light which enters the photoelectric conversion layer 111 enters not from a substrate 310 side but from a substrate 360 side, and moreover, light which enters TFTs 501 and 502 enters not from the substrate 360 side but from the substrate 310. The housing 604 is provided with openings that are formed in a region where the TFTs 501 and 502 are formed at the substrate 310 side and a region where the photoelectric conversion layer 111 is formed at the substrate 360 side.

In FIG. 13B, there is a gate electrode between incident light and an island-shaped semiconductor region in each of the TFTs 501 and 502; however, light which does not pass through the gate electrode enters the island-shaped semiconductor region of the TFTs 501 and 502. Accordingly, a photoelectric current can be generated and light can be detected. In addition, light which enters from the substrate 360 side enters diagonally the photoelectric conversion layer 111 through a sealing layer 324; accordingly, a photoelectric current can be generated and light can be detected.

Note that this Embodiment can be combined with any description in Embodiment Mode and Embodiments 1 to 4.

[Embodiment 6]

In this embodiment, a circuit which switches a power source (bias) as a bias switching means will be described with reference to FIG. 22, FIG. 23, FIG. 25, FIG. 26 and FIG. 27.

Figure 22:
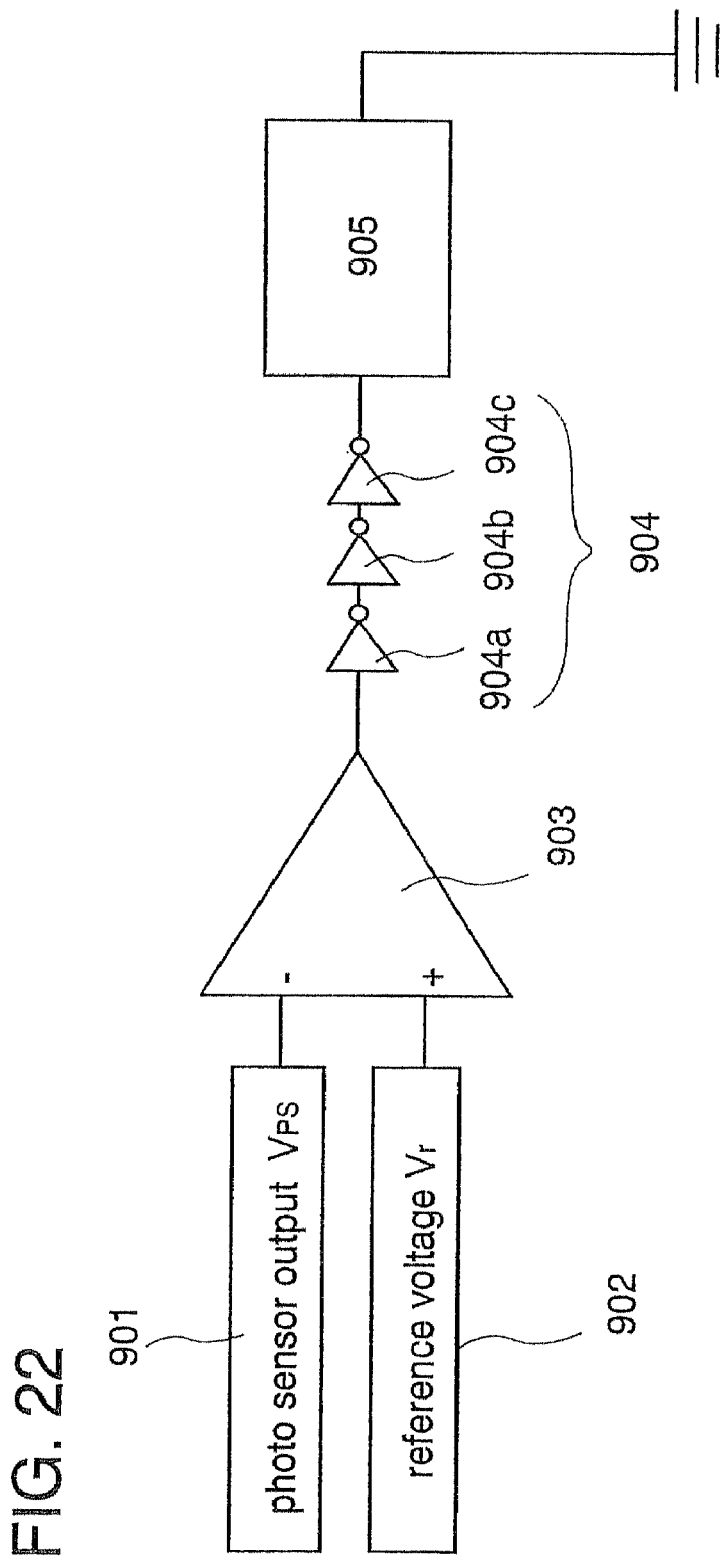
FIG. 22 is a diagram showing a circuit configuration of a circuit which switches a power source (bias) of the present invention.
Figure 23:
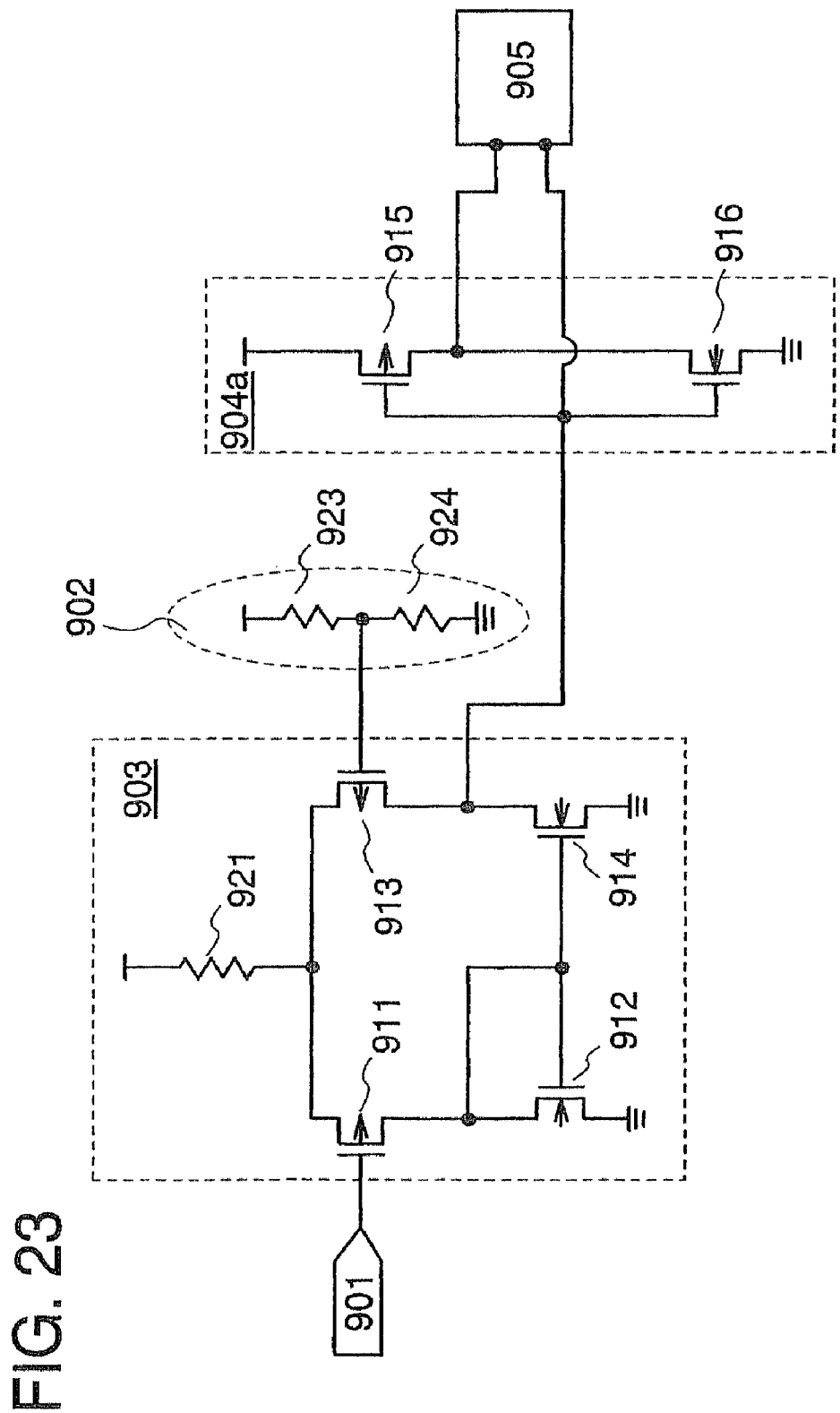
FIG. 23 is a diagram showing a circuit configuration of a circuit which switches a power source (bias) of the present invention.

In FIG. 22 and FIG. 23, reference numeral 901 denotes a photo sensor output $V_{PS}$, 902; a reference voltage generating circuit to determine a reference voltage $V_r$, 903; a comparator, and 904; an output buffer having a first stage 904*a*, a second stage 904*b* and a third stage 904*c*. In FIG. 22, only three stages of the output buffer are described; however, four or more stages of the output buffer can be provided, or alternatively, only one stage of the output buffer can be provided. In addition, reference numeral 905 denotes internal resistor of a TFT of a current mirror circuit.

FIG. 23 shows a specific circuit configuration of FIG. 22, and the comparator 903 has p-channel TFTs 911 and 913, n-channel TFTs 912 and 914 and a resistor 921. Also, the reference voltage generating circuit 902 has resistors 923 and 924. In addition, in FIG. 23, the first stage 904*a* of the output buffer 904 is shown, and the first stage 904*a* of the output buffer 904 is formed from a p-channel TFT 915 and an n-channel TFT 916. In FIG. 23, an n-channel TFT is a single gate TFT which has one gate electrode; however, in order to reduce an off current, the n-channel TFT may be formed of a multi gate TFT which has a plurality of gate electrodes, for example, a double gate TFT which has two gate electrodes. Note that the other stages may be formed in the same circuit as 904*a*.

Figure 26A:
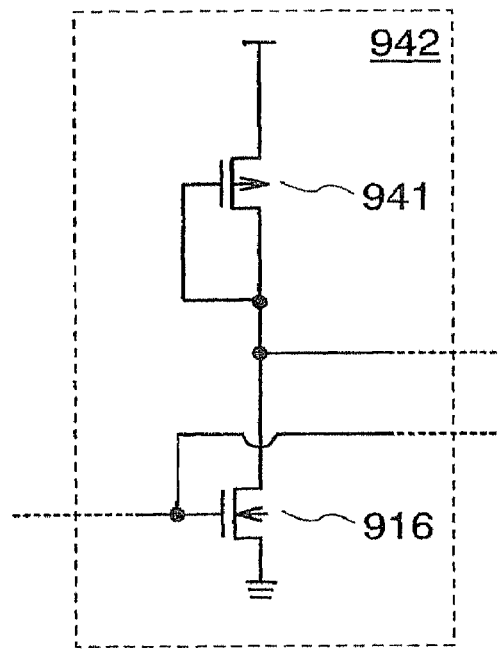
FIGS. 26A and 26B are views each showing a circuit configuration of a circuit which switches a power source (bias) of the present invention.
Figure 26B:
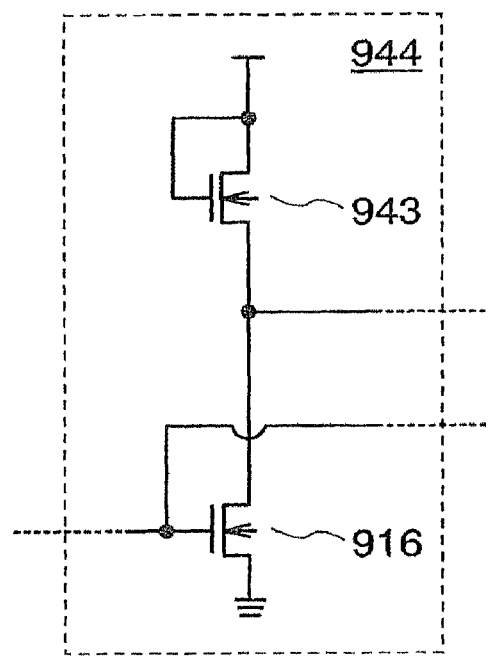
Figure 27A:
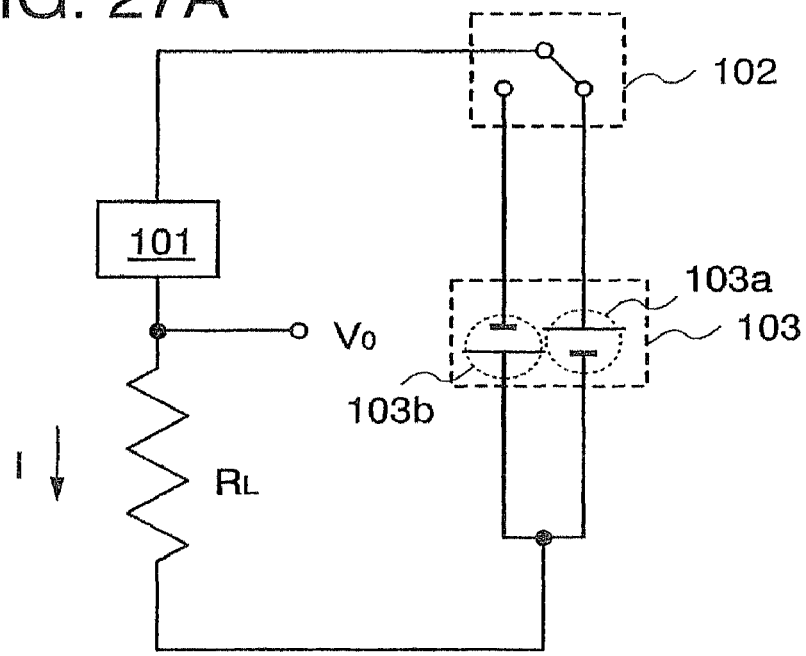
FIGS. 27A and 27B are views each showing a circuit configuration of a circuit which switches a power source (bias) of the present invention.
Figure 27B:
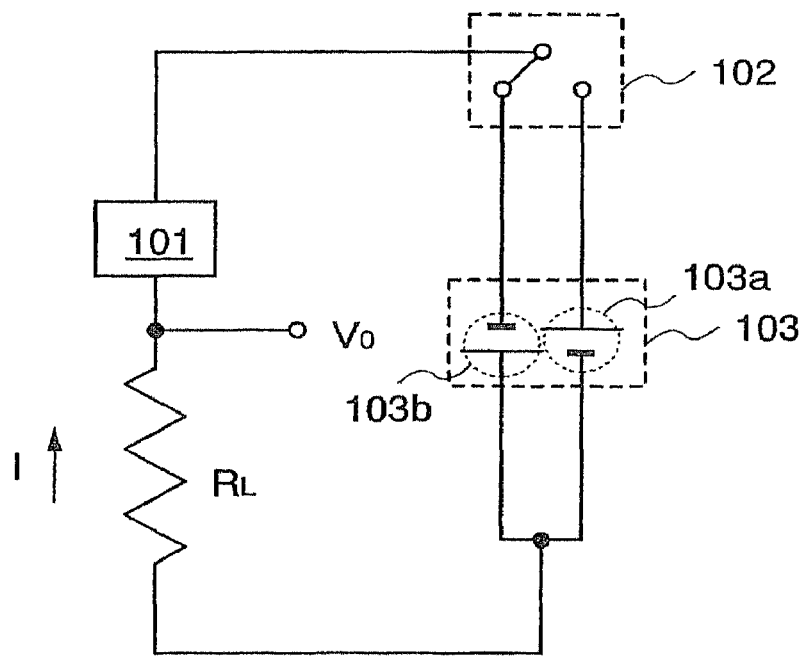

In FIG. 23, the first stage 904*a* of the output buffer 904 may be substituted for a circuit 942 shown in FIG. 26A and a circuit 944 shown in FIG. 26B. The circuit 942 shown in FIG.

26A is formed from an n-channel TFT 916 and a p-channel TFT 941, and the circuit shown in FIG. 26B is formed from n-channel TFTs 916 and 943.

Note that an output voltage $V_O$ of the current mirror circuit may be used for the photo sensor $V_{PS}$, and a voltage in which the output voltage $V_O$ of the current mirror circuit is amplified in an amplifier circuit may also be used.

In the circuit shown in FIG. 22, when the output voltage $V_O$ of the current mirror circuit reaches a certain value, a power source voltage of the current mirror circuit is reversed. The circuit shown in FIG. 22 reverses the power source in a case where the output voltage exceeds $V_r$, having the reference voltage $V_r$ as a boundary. In FIG. 23, the reference voltage $V_r$ is determined by the reference voltage generating circuit 902. In addition, the reference voltage $V_r$ may use voltage which is applied to a load by a current in which current amount generated when a photo sensor receives light of 100 lx is amplified by the current mirror circuit.

Figure 25A:
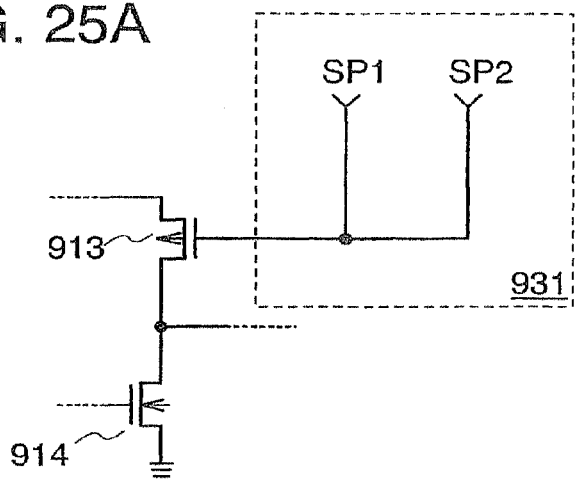
FIGS. 25A and 25B are views each showing a circuit configuration of a circuit which switches a power source (bias) of the present invention.
Figure 25B:
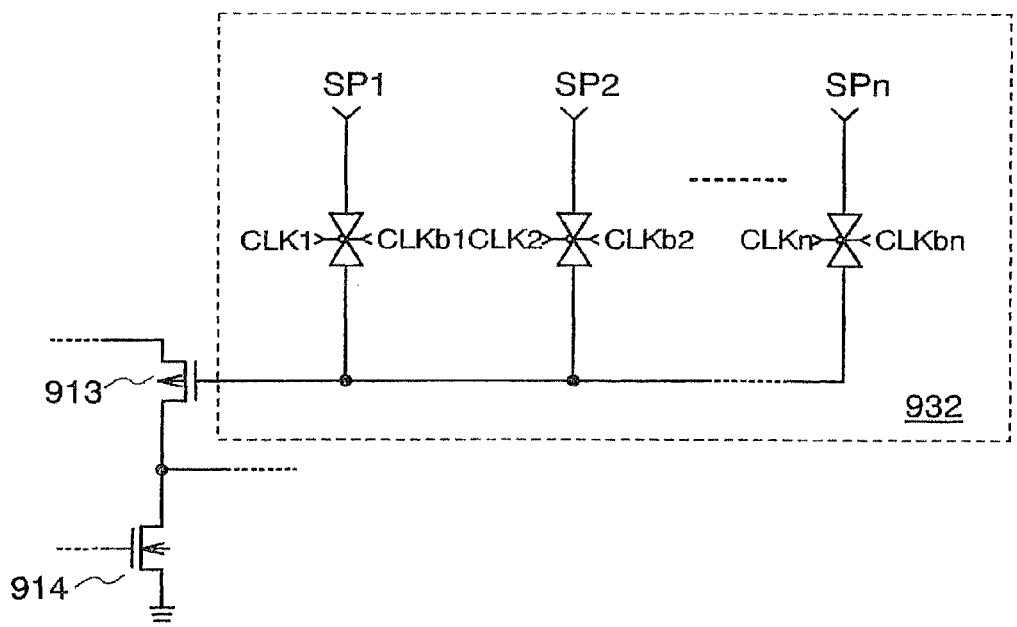

In FIG. 23, the reference voltage $V_r$ is determined by the reference voltage generating circuit; however, the reference voltage $V_r$ may be directly inputted from an external circuit 931 (FIG. 25A), or inputted from a circuit 932 selecting several input voltage by using a selector (an analog switch or the like) (FIG. 25B).

In addition, in the circuit shown in FIG. 23, the reference voltage $V_r$ is required to be more than a threshold voltage ($V_{th} \leq V_r$ when the threshold voltage is $V_{th}$) of a TFT which is included in the comparator. It is necessary that the reference voltage or the photo sensor output voltage $V_{PS}$ is adjusted so as to satisfy this voltage.

The photo sensor output $V_{PS}$ is inputted to the gate electrode of the p-channel TFT 911 of the comparator 903, and is compared with a voltage value from the reference voltage generating circuit 902. In a case where the photo sensor output $V_{PS}$ is lower than a voltage value from the reference voltage generating circuit, the photo sensor output $V_{PS}$ is connected to a power source 103a of a power source 103, and a current flows in a direction shown in FIG. 27A. In addition, in a case where the photo sensor output $V_{PS}$ is higher than a voltage value from the reference voltage generating circuit, the photo sensor output $V_{PS}$ is connected to a power source 103b of the power source 103, and a current flows in a direction shown in FIG. 27B.

[Embodiment 7]

In this embodiment, an example in which a light detective portion which is obtained by the present invention is incorporated to various electronic devices will be described. As an electronic device to which the present invention is applied, a computer, a display, a cellular phone, a TV set or the like are given. Specific examples of those electronic devices are shown in FIG. 14, FIGS. 15A and 15B, FIGS. 16A and 16B and FIG. 17.

FIG. 14 shows a cellular phone including a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711 and a light detective portion 712. The present invention can be applied to the light detective portion 712.

The light detective portion 712 detects light which transmits the light-transmitting material portion, controls luminance of the display panel (A) 708 and the display panel (B) 709 in accordance with illuminance of detected external light, or controls illumination of the operation keys 704 in accordance with illuminance which is obtained by the light detective portion 712. Accordingly, current consumption of a cellular phone can be suppressed.

Figure 15A:
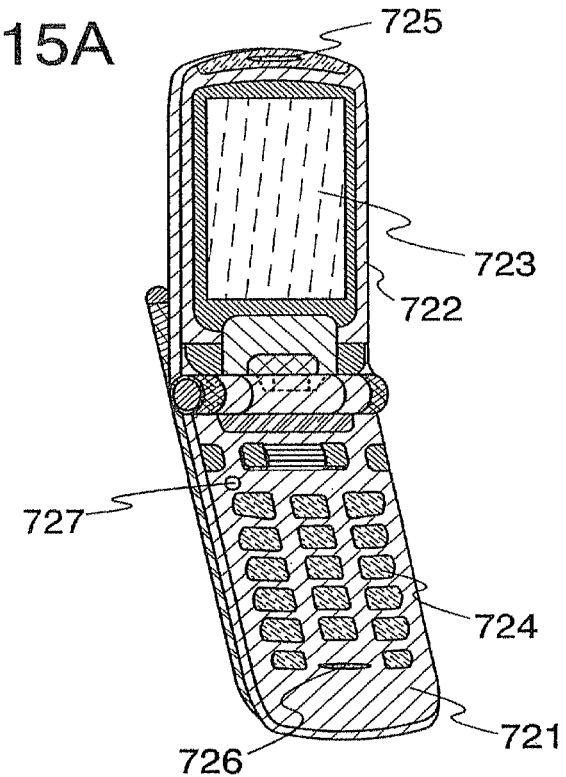
FIGS. 15A and 15B are views each showing a device on which a photoelectric conversion device of the present invention is mounted.
Figure 15B:
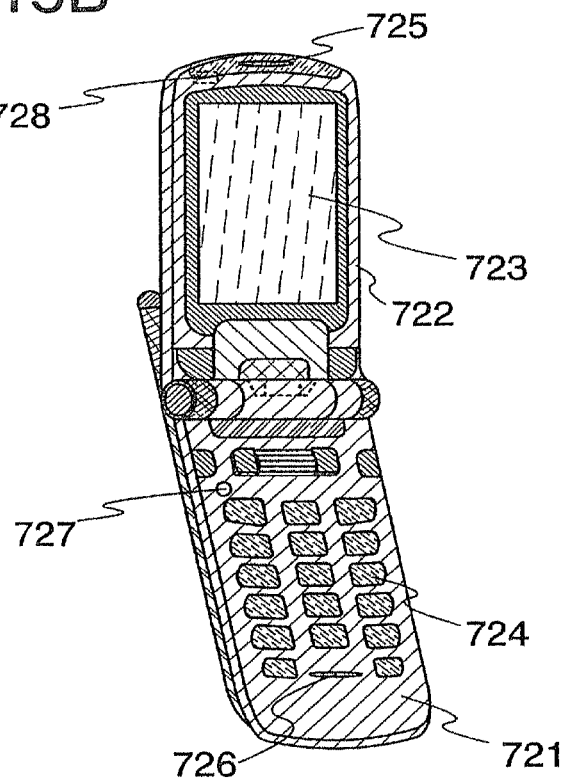

FIGS. 15A and 15B show another example of a cellular phone. In FIGS. 15A and 15B, reference numeral 721 denotes a main body, 722; housing, 723; a display panel, 724; operation keys, 725; an audio output portion, 726; an audio input portion, and 727 and 728; light detective portions.

In a cellular phone shown in FIG. 15A, luminance of the display panel 723 and the operation keys 724 can be controlled by detecting external light by the light detective portion 727 which is provided at the main body 721.

Also, in a cellular phone shown in FIG. 15B, in addition to the structure of FIG. 15A, the light detective portion 728 is provided inside the main body 721. By the light detective portion 728, luminance of backlight provided at the display portion 723 can be detected.

Figure 16A:
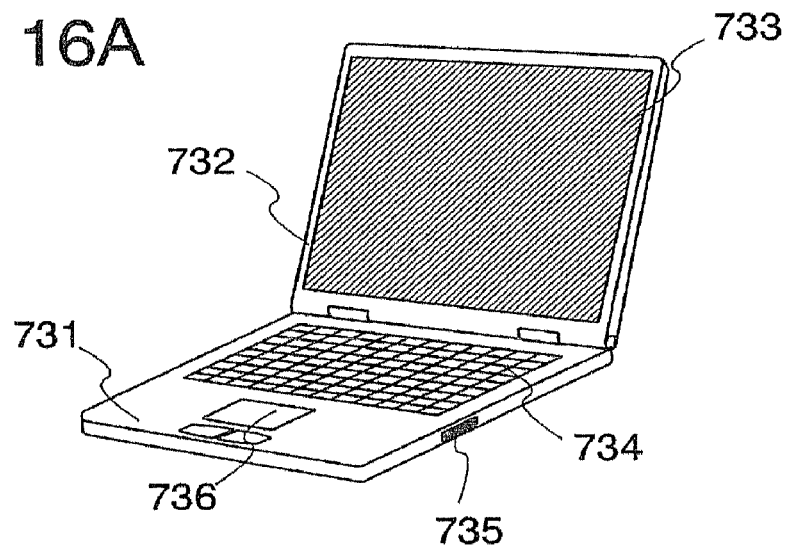
FIGS. 16A and 16B are views each showing a device on which a photoelectric conversion device of the present invention is mounted.

FIG. 16A shows a computer including a main body 731, a housing 732, a display portion 733, a keyboard 734, an external connection port 735, a pointing mouse 736 and the like.

Figure 16B:
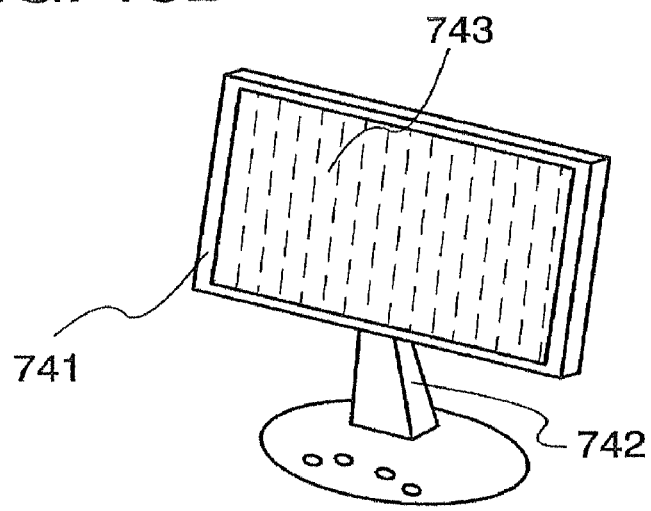

FIG. 16B shows a display device, and a television receiver or the like corresponds to this. The display device includes a housing 741, a supporting base 742, a display portion 743, and the like.

Figure 17:
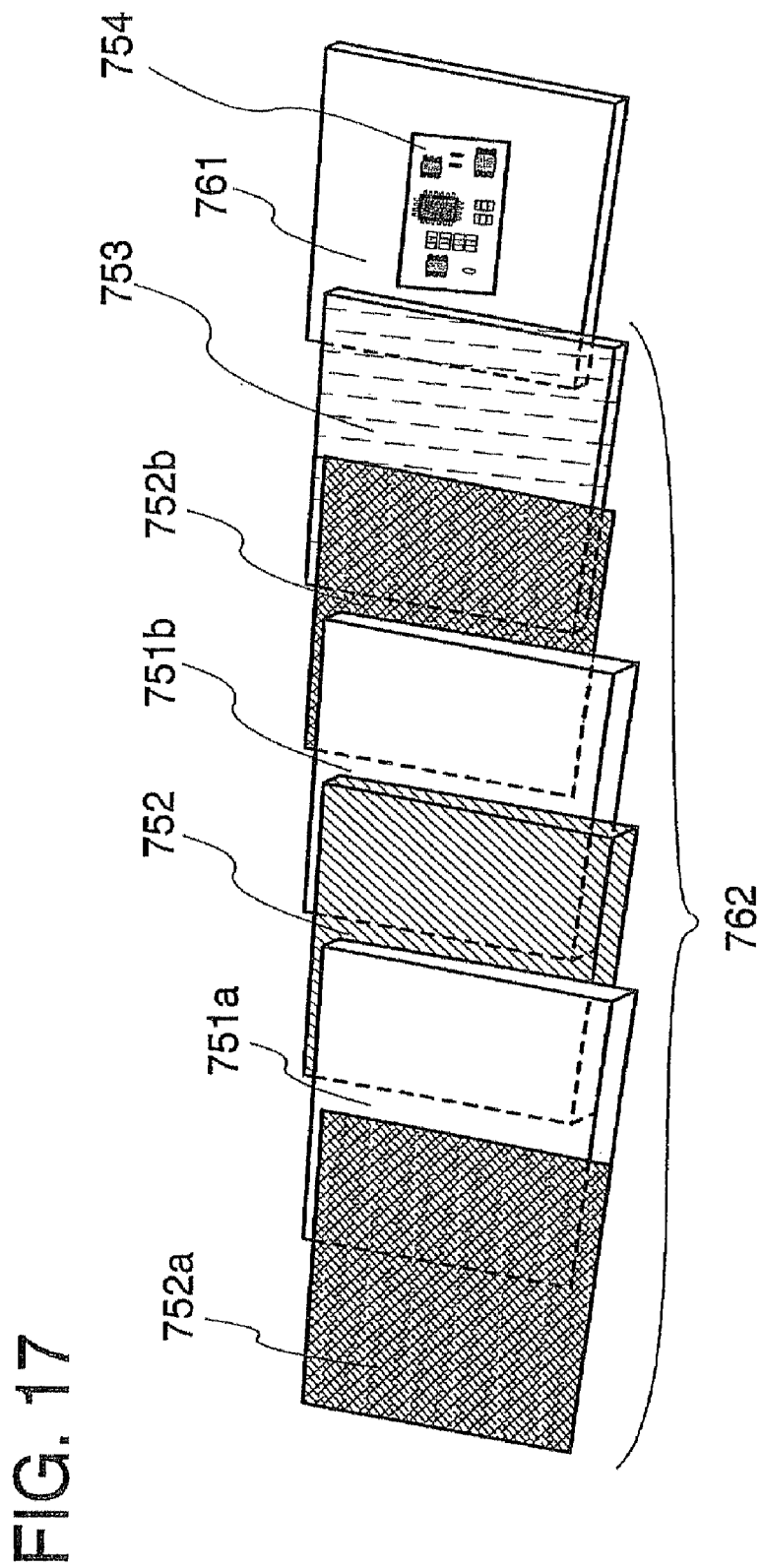
FIG. 17 is a view showing a device on which a photoelectric conversion device of the present invention is mounted.

As the display portion 733 which is provided for the computer of FIG. 16A and the display portion 743 of the display device shown in FIG. 16B, a specific structure in a case of using a liquid crystal panel is shown in FIG. 17.

A liquid crystal panel 762 shown in FIG. 17 is incorporated in a housing 761, and includes substrates 751a and 751b, a liquid crystal layer 752 sandwiched between the substrates 751a and 751b, polarized filters 752a and 752b, a backlight 753, and the like. A light detective portion 754 is formed at the housing 761.

The light detective portion 754 which is manufactured by using the present invention detects the light amount from the backlight 753, and luminance of the liquid crystal panel 762 is adjusted when information thereof is fed back.

Figure 18A:
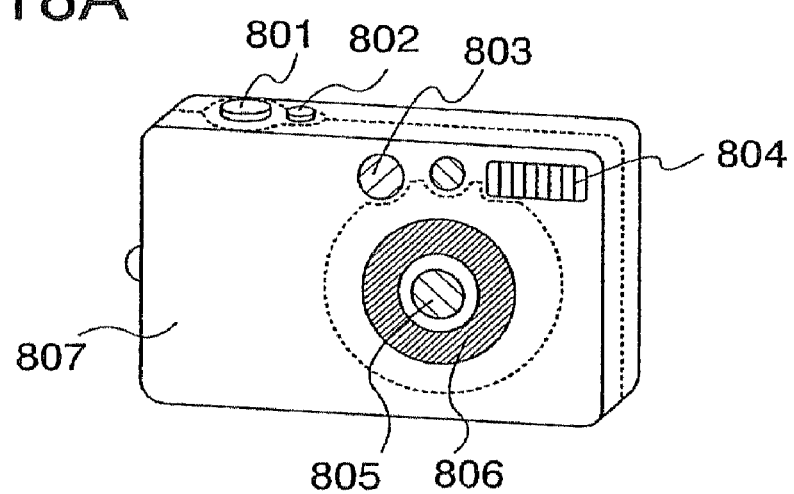
FIGS. 18A and 18B are views each showing a device on which a photoelectric conversion device of the present invention is mounted.
Figure 18B:
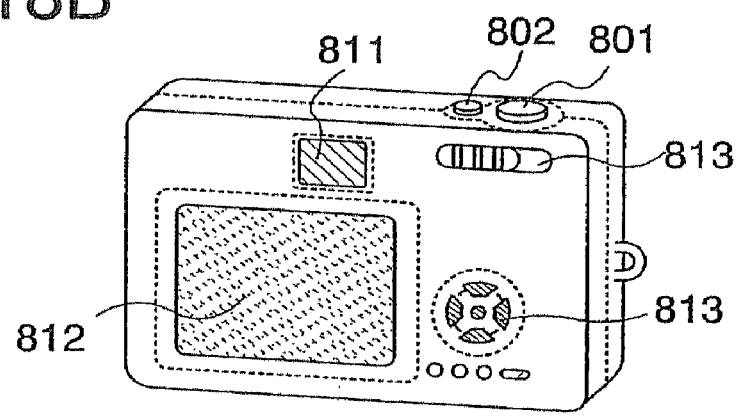

FIGS. 18A and 18B are views each showing an example in which the light detective of the present invention is incorporated in a camera, for example, a digital camera. FIG. 18A is a front perspective view of the digital camera, and FIG. 18B is a back perspective view of the digital camera. In FIG. 18A, the digital camera is provided with a release button 801, a main switch 802, a finder window 803, a flush 804, a lens 805, a camera cone 806, and a housing 807.

In addition, in FIG. 18B, a finder eyepiece window 811, a monitor 812 and operation buttons 813 are provided.

When the release button 801 is held down to the half position, focusing mechanism and exposure mechanism are operated, and when the release button is held down to the lowest position, a shutter is opened.

The main switch 802 switches ON or OFF of a power source of a digital camera by holding down or rotating.

The finder window 803 is placed at the upper portion of the front lens 805 of the digital camera, and is a device for recognizing an area which is taken or a focus position from the finder eyepiece window 811 shown in FIG. 18B.

The flush 804 is placed at the upper portion of the anterior surface of the digital camera, and when object luminance is low, supporting light is emitted concurrently with the opening of the shutter by being held down.

The lens 805 is placed at the front face of the digital camera. The lens is formed of a focusing lens, a zoom lens, or the like, and forms a photographing optical system with a shutter and an aperture that are not shown. In addition, an image pickup device such as CCD (Charge Coupled Device) is provided at the rear of the lens.

The camera cone 806 moves a lens position to adjust the focus of the focusing lens, the zoom lens, and the like. When shooting, the camera cone is slid out to move the lens 805 forward. In addition, when carrying it, the lens 805 is moved backward to be compact. Note that a structure is employed in this embodiment, in which the object can be shot by zooming by sliding out the camera cone; however, a structure is not limited thereto, and a structure may also be employed, in which shooting can be conducted by zooming without sliding out the camera cone by a photographing optical system inside the housing 807.

The finder eyepiece window 811 is provided at the upper portion of the rear surface of the digital camera, for looking through when checking an area which is taken or a focus point.

The operation buttons 813 are buttons for various functions that are provided at the rear surface of the digital camera and include a set up button, a menu button, a display button, a functional button, a selection button, and the like.

When the light detective portion of the present invention is incorporated in the camera shown in FIGS. 18A and 18B, the light detective portion can detect whether or not light exists and the light intensity, and accordingly, an exposure adjustment or the like of the camera can be performed.

In addition, the light detective portion of the present invention can be applied to other electronic devices, for example, a projection TV and a navigation system. That is, the light sensor of the present invention can be used for any device which is required to detect light.

Note that this embodiment can be combined with any description in Embodiment Mode, and Embodiments 1 to 6.

By the present invention, a photoelectric conversion device which can detect a wide range of light intensity ranging from weak light to strong light can be manufactured. In addition, by incorporating the photoelectric conversion device of the present invention, an electronic device having high reliability can be obtained.

This application is based on Japanese Patent Application serial No. 2005-148864 filed in Japan Patent Office on May 23 in 2005, the entire contents of which are hereby incorporated by reference.

What is claimed is:

1. A photoelectric conversion device comprising:
a photodiode comprising a photoelectric conversion layer;
an amplifier circuit comprising a thin film transistor;
an output terminal electrically connected to the photodiode and the amplifier circuit;
a power source for applying a bias to the photodiode and the amplifier circuit; and
a bias switching circuit configured to change the bias to the photodiode and the amplifier circuit in accordance with an output from the output terminal.

2. The photoelectric conversion device according to claim 1,
wherein the photoelectric conversion layer comprising a p-type semiconductor layer, an i-type semiconductor layer and an n-type semiconductor layer.

3. The photoelectric conversion device according to claim 1,
wherein the photodiode and the amplifier circuit are formed over a light-transmitting substrate.

4. The photoelectric conversion device according to claim 1,
wherein a direction of incident light which is detected by the photodiode is the same as a direction of incident light which is detected by the thin film transistor.

5. The photoelectric conversion device according to claim 1,
wherein the thin film transistor is a top gate thin film transistor.

6. The photoelectric conversion device according to claim 1,
wherein a direction of incident light which is detected by the photodiode and a direction of incident light which is detected by the thin film transistor are opposite to each other, with a substrate as a center.

7. The photoelectric conversion device according to claim 1,
wherein the thin film transistor is a bottom gate thin film transistor.

8. The photoelectric conversion device according to claim 1,
wherein the bias is reversed by the bias switching circuit in accordance with the output from the output terminal.

9. The photoelectric conversion device according to claim 1,
wherein the power source includes at least first and second bias sources and the bias switching circuit is configured to selectively connect one of the first and second bias sources to the photodiode and the amplifier circuit.

10. A photoelectric conversion device comprising:
a first photosensor;
a second photosensor;
an output terminal electrically connected to the first photosensor and the second photosensor;
a power source for applying a bias to the first photosensor and the second photosensor; and
a bias switching circuit configured to change the bias to the first photosensor and the second photosensor in accordance with an output from the output terminal.

11. The photoelectric conversion device according to claim 10,
wherein the first photosensor comprises a photodiode.

12. The photoelectric conversion device according to claim 10,
wherein the first photosensor and the second photosensor are formed over a same substrate.

13. The photoelectric conversion device according to claim 10,
wherein a direction of incident light which is detected by the first photosensor is the same as a direction of incident light which is detected by the second photosensor.

14. The photoelectric conversion device according to claim 10,
wherein the second photosensor includes a thin film transistor.

15. The photoelectric conversion device according to claim 10,
wherein the bias is reversed by the bias switching circuit in accordance with the output from the output terminal.

16. The photoelectric conversion device according to claim 10,
wherein the power source includes at least first and second bias sources and the bias switching circuit is configured to selectively connect one of the first and second bias sources to the first photosensor and the second photosensor.

17. A photoelectric conversion device comprising:
a first photosensor including a first photoelectric conversion layer comprising amorphous silicon;
a second photosensor including a second photoelectric conversion layer comprising crystalline silicon;
an output terminal electrically connected to the first photosensor and the second photosensor;

a power source for applying a bias to the first photosensor and the second photosensor; and a bias switching circuit configured to change the bias to the first photosensor and the second photosensor in accordance with an output from the output terminal.

18. The photoelectric conversion device according to claim 17, wherein the first photoelectric conversion layer and the second photoelectric conversion layer are formed over a same substrate.

19. The photoelectric conversion device according to claim 17, wherein the first photosensor is a photodiode.

20. The photoelectric conversion device according to claim 17, wherein the second photosensor is an amplifier circuit including a thin film transistor.

21. The photoelectric conversion device according to claim 17, wherein the bias is reversed by the bias switching circuit in accordance with the output from the output terminal.

22. The photoelectric conversion device according to claim 17, wherein the power source includes at least first and second bias sources and the bias switching circuit is configured to selectively connect one of the first and second bias sources to the first photosensor and the second photosensor.

23. A photoelectric conversion device according to claim 1, wherein the photodiode comprises a first terminal and a second terminal;

wherein the amplifier circuit comprises a third terminal and a fourth terminal, the third terminal of the amplifier circuit being electrically connected to the first terminal of the photodiode; and wherein the output terminal is electrically connected to the second terminal of the photodiode and to the fourth terminal of the amplifier circuit.

24. A photoelectric conversion device according to claim 10, wherein the first photosensor comprises a first terminal and a second terminal;

wherein the second photosensor comprises a third terminal and a fourth terminal, the third terminal of the second photosensor being electrically connected to the first terminal of the first photosensor; and wherein the output terminal is electrically connected to the second terminal of the first photosensor and to the fourth terminal of the second photosensor.

25. A photoelectric conversion device according to claim 17, wherein the first photosensor comprises a first terminal and a second terminal;

wherein the second photosensor comprises a third terminal and a fourth terminal, the third terminal of the second photosensor being electrically connected to the first terminal of the first photosensor; and wherein the output terminal is electrically connected to the second terminal of the first photosensor and to the fourth terminal of the second photosensor.

* * * * *